US008385855B2

(12) United States Patent
Lorg et al.

(10) Patent No.: US 8,385,855 B2
(45) Date of Patent: Feb. 26, 2013

(54) DUAL CONVERSION TRANSMITTER WITH SINGLE LOCAL OSCILLATOR

(75) Inventors: Shawn M. Lorg, Chandler, AZ (US); Kenneth V. Buer, Gilbert, AZ (US)

(73) Assignee: ViaSat, Inc., Carlsbad, CA (US)

( * ) Notice: Subject to any disclaimer, the term of this patent is extended or adjusted under 35 U.S.C. 154(b) by 564 days.

(21) Appl. No.: 12/614,293

(22) Filed: Nov. 6, 2009

(65) Prior Publication Data
US 2010/0117693 A1 May 13, 2010

Related U.S. Application Data

(60) Provisional application No. 61/112,538, filed on Nov. 7, 2008.

(51) Int. Cl.
*H04B 1/04* (2006.01)
*H01Q 11/12* (2006.01)
(52) U.S. Cl. ......... 455/118; 455/103; 455/113; 455/316
(58) Field of Classification Search .................. 455/118, 455/91, 112, 113, 115.1, 313, 316, 318, 323, 455/101–103, 293, 258
See application file for complete search history.

(56) References Cited

U.S. PATENT DOCUMENTS

| | | | |
|---|---|---|---|
| 4,580,289 A * | 4/1986 | Enderby | 455/314 |
| 4,628,358 A * | 12/1986 | Robbins | 380/235 |
| 4,814,887 A * | 3/1989 | Marz et al. | 348/735 |
| 4,918,532 A * | 4/1990 | O'Connor | 348/726 |
| 5,239,685 A | 8/1993 | Moe et al. | |
| 5,307,029 A | 4/1994 | Schenk | |
| 5,410,747 A * | 4/1995 | Ohmagari et al. | 455/118 |
| 5,666,355 A | 9/1997 | Huah et al. | |
| 5,734,970 A | 3/1998 | Saito | |
| 5,890,051 A | 3/1999 | Schlang et al. | |
| 5,924,021 A * | 7/1999 | Paul et al. | 455/209 |
| 5,937,335 A | 8/1999 | Park et al. | |
| 5,995,812 A | 11/1999 | Soleimani et al. | |
| 6,032,048 A * | 2/2000 | Hartless et al. | 455/506 |
| 6,115,584 A | 9/2000 | Tait et al. | |

(Continued)

FOREIGN PATENT DOCUMENTS

KR 10-2004-0063871 A 7/2004
KR 10-2004-0102017 A 12/2004

(Continued)

OTHER PUBLICATIONS

USPTO; Notice of Allowance for U.S. Appl. No. 11/465,760 dated Aug. 8, 2010.

(Continued)

*Primary Examiner* — Pablo Tran
(74) *Attorney, Agent, or Firm* — Snell & Wilmer L.L.P.

(57) ABSTRACT

The present disclosure relates to systems, devices and methods related to transmitters, and/or transceivers having a single, tunable oscillator in a dual conversion architecture. In various exemplary embodiments, this transmitter may include: a first mixer configured to receive a first oscillator signal from the single oscillator; a filter configured to band pass filter the converted signal and output a filtered signal; and a second mixer in communication with the filter, configured to receive the filtered signal. This dual conversion transmitter may be configured to receive a communication signal from an input to the transmitter and to output a converted signal based on the first oscillator signal and the communication signal. The second mixer may be configured to receive a scaled version of the first oscillator signal and to output a desired frequency output signal based on the scaled version of the first oscillator signal and the filtered signal.

4 Claims, 16 Drawing Sheets

U.S. PATENT DOCUMENTS

| | | | |
|---|---|---|---|
| 6,452,909 B1 | 9/2002 | Bauer | |
| 6,600,906 B1 * | 7/2003 | Roppongi | 455/118 |
| 6,628,927 B1 * | 9/2003 | Samuels | 455/77 |
| 6,725,019 B2 * | 4/2004 | Higuchi | 455/84 |
| 7,116,706 B2 | 10/2006 | Cook et al. | |
| 7,590,391 B2 * | 9/2009 | Seo et al. | 455/90.2 |
| 7,663,502 B2 * | 2/2010 | Breed | 340/12.25 |
| 2002/0164965 A1 * | 11/2002 | Chominski et al. | 455/118 |
| 2003/0027530 A1 | 2/2003 | Levitt et al. | |
| 2004/0048588 A1 | 3/2004 | Ammar et al. | |
| 2005/0166230 A1 * | 7/2005 | Gaydou et al. | 725/41 |
| 2008/0291987 A1 * | 11/2008 | Kumaki et al. | 375/224 |
| 2010/0175086 A1 * | 7/2010 | Gaydou et al. | 725/39 |
| 2011/0136443 A1 * | 6/2011 | Milenkovic et al. | 455/76 |

FOREIGN PATENT DOCUMENTS

| | | |
|---|---|---|
| KR | 10-0667040 B1 | 1/2007 |
| WO | 2004/023675 | 3/2004 |

OTHER PUBLICATIONS

Office Action, U.S. Appl. No. 12/961,211, dated Jun. 24, 2011.
USPTO; Notice of Allowance for U.S. Appl. No. 12/614,288 dated Oct. 20, 2011.
USPTO; Notice of Allowance for U.S. Appl. No. 12/961,211 dated Dec. 12, 2011.
International Search Authority, International Search Report and Written Opinion, Jun. 16, 2010, 9 pgs.
Jian Zhang et al Single Local-Oscillator Solution for Multiband OFDM Systems Communications, 2007.ICC'07.IEEE International Conference, Glasgow IEEE, Jun. 24-28, 2007, pp. 4116-4121.
USPTO; Office Action for U.S. Appl. No. 12/614,288 dated Aug. 31, 2010.
Tino Copani, Santo A. Smerzi, Giovanni Girlando and Giuseppe Palmisano; A 12-GHz Silocon Bipolar Dual-Conversion Receiver for Digital Satellite Applications; IEEE Journal of Solid-State Circuits, vol. 40, No. 6, Jun. 2005; pp. 1278-1287.
USPTO; Office Action for U.S. Appl. No. 10/059,465 dated Apr. 21, 2005.
USPTO; Notice of Allowance for U.S. Appl. No. 10/059,465 dated Oct. 19, 2005.
USPTO; Office Action for U.S. Appl. No. 10/233,886 dated Apr. 21, 2005.
USPTO; Office Action for U.S. Appl. No. 10/233,886 dated Oct. 18, 2005.
USPTO; Notice of Allowance for U.S. Appl. No. 10/233,886 dated Apr. 13, 2006.
USPTO; Office Action for U.S. Appl. No. 11/275,932 dated Apr. 25, 2006.
USPTO; Office Action for U.S. Appl. No. 11/275,932 dated Nov. 28, 2006.
USPTO; Notice of Allowance for U.S. Appl. No. 11/275,932 dated May 18, 2007.
USPTO; Office Action for U.S. Appl. No. 11/465,760 dated Oct. 3, 2007.
USPTO; Office Action for U.S. Appl. No. 11/465,760 dated Apr. 21, 2008.
USPTO; Office Action Restriction for U.S. Appl. No. 11/465,760 dated Dec. 4, 2008.
USPTO; Final Office Action for U.S. Appl. No. 11/465,760 dated Mar. 6, 2009.
USPTO; Office Action for U.S. Appl. No. 11/465,760 dated Dec. 11, 2009.
USPTO; Office Action for U.S. Appl. No. 12/614,288 dated Mar. 17, 2011.
International Preliminary Report on Patentability dated May 19, 2011 in International Application No. PCT/US2009/063645.

* cited by examiner

Distribution Pattern

Practical Distribution Illustration

DUAL CONVERSION TRANSMITTER WITH SINGLE LOCAL OSCILLATOR

CROSS REFERENCE TO RELATED APPLICATIONS

This application claims the benefit of, and priority to, provisional patent application having Ser. No. 61/112,538 filed Nov. 7, 2008 entitled "DUAL CONVERSION TRANSMITTER WITH SINGLE LOCAL OSCILLATOR".

FIELD OF INVENTION

The present invention relates to transmitters, and/or transceivers. More particularly, the invention relates to systems, devices and methods related to transmitters, and/or transceivers having a single, tunable oscillator in a dual conversion architecture.

BACKGROUND OF THE INVENTION

Various existing transmitters, and/or transceivers (hereinafter transmitter(s)) may employ a dual conversion architecture for up or down conversion of radio frequency ("RF") signals. Such a transmitter is generally configured in the prior art to use two, separate local oscillators. More particularly, when the transmitter is a tunable transmitter, the dual conversion architecture comprises two or more separate local oscillators.

With reference to FIG. 1A, a prior art tunable dual conversion transmitter 100 comprises at least two local oscillators 110, 111. Local oscillator 110 is a tunable LO, that is tunable from 9.8 to 11.2 GHz. Tunable dual conversion transmitter 100 further comprises a first mixer 120, a filter 125, and a second mixer 130.

With reference to FIG. 1B, a prior art tunable transmitter 100' comprises a local oscillator 110. Local oscillator 110 is a tunable LO, that is tunable from 10.133 to 10.6 GHz. Tunable transmitter 100' further comprises a first mixer 120, and a filter 125. In this embodiment, spurious signals can be difficult to filter because IF related spurious signals are typically a small percentage away from generally desired RF passbands. Additionally, each band will require filtering to remove undesired IF related spurious signals. Thus, resulting in unnecessarily high material costs. This approach achieves a high phase noise degradation of approximately 20 log(3) =9.54 dB.

Use of two or more local oscillators in tunable transmitters that have dual conversion architecture has a number of disadvantages. For example, in such embodiments the Intermediate Frequency ("IF") band following the first upconversion, at first mixer 120, must be just as wide as the final output band. Also, one of the oscillators, e.g. local oscillator 110, must be able to tune the transmitter across the entire band. Furthermore, the final upconversion uses a local oscillator at a high frequency that is more difficult to design with adequate phase noise than the first LO.

Wider filter passbands employed by such prior art may be difficult if not impossible to design because, in some instances, undesired higher order spurious mixer outputs related to multiples of LO and IF input frequencies may be too close to the pass-band to adequately filter or may even be inside the filter pass-band thus prohibiting a single filter approach. In any event, it may be difficult to design a cost effective device comprising multiple local oscillators in tunable transmitters with a dual conversion architecture. In some instances, use of such prior art designs may also necessitate use of a switchable bank of filters, which increases overall design cost. Use of prior art architecture also renders it difficult if not practically impossible to use highly integrated GaAs, silicon-germanium (SiGe) or other semiconductor processes in tunable transmitters and obtain sufficient spurious rejection, due to process variations that give rise to additional design limitations.

Thus, it is desirable to have a tunable transmitter with dual conversion architecture that overcomes some of these drawbacks of the prior art. It is further desirable to have a tunable transmitter with dual conversion architecture with lower material costs, that is easier to manufacture, that has improved phase noise characteristics, that reduces the range the LO has to tune, and that reduces the IF bandwidth.

SUMMARY OF THE INVENTION

In accordance with various aspects of the invention, a method and system for a tunable dual conversion transmitter that has a single tunable oscillator is presented. In one exemplary embodiment, an electronic device may include (1) a first mixer configured to receive a first oscillator signal; the first mixer configured to receive a communication signal from an input to the electronic device; the first mixer configured to output a converted signal based on the first oscillator signal and the communication signal; (2) a filter configured to remove undesired spurious signals from the converted signal and output a filtered signal; and (3) a second mixer in communication with the filter and configured to receive the filtered signal, the second mixer configured to receive a scaled version of the first oscillator signal; the second mixer in communication with an output of the electronic device and configured to output an output signal based on the scaled version of the first oscillator signal and the filtered signal. The electronic device may include one of: a multiple conversion transmitter, and a multiple conversion transceiver, and wherein the output signal has an output frequency that is tunable over an output frequency range by adjusting a frequency associated with the first oscillator signal over a first oscillator signal frequency range. The output of the electronic device may be an RF transmit signal, and wherein the RF transmit signal is configured to be frequency tuned to a desired color pattern (as further described herein). The RF transmit signal may be tunable over a transmit frequency range.

In an alternative exemplary embodiment includes a dual conversion transmitter. The transmitter may be configured to divide a first oscillator signal into a second oscillator signal and a third oscillator signal. The transmitter may be configured to perform frequency scaling such that the second and third oscillator signals have different frequencies from each other. The transmitter may include: (1) a first mixer, wherein the first mixer is configured to utilize the second oscillator signal to facilitate frequency conversion; and (2) a second mixer, wherein the second mixer is configured to utilize the third oscillator signal to facilitate frequency conversion; and (3) a filter configured to filter the output of the first mixer and to provide the output of the filter to the input of the second mixer.

In an alternative exemplary embodiment, a method of producing an output signal via a dual conversion transmitter may include: (1) receiving a first oscillator signal, wherein the first oscillator signal is provided by a single tunable oscillator; (2) receiving a communication signal from an input to the dual conversion transmitter, wherein a first mixer may be configured to receive the communication signal; (3) providing a converted signal based on the first oscillator signal and the communication signal, wherein the first mixer may be configured to output the converted signal; (4) band pass filtering the converted signal to create a filtered signal, wherein a filter may be configured to provide the band pass filtering; (5) receiving the filtered signal, wherein a second mixer is in communication with the filter and configured to receive the filtered signal; (6) converting the filtered signal, in the second mixer, based on a scaled version of the first oscillator signal, wherein the second mixer may be in communication with an output of the dual conversion transmitter; and (7) delivering an output signal based on the scaled version of the first oscillator signal and the filtered signal to the output.

BRIEF DESCRIPTION OF THE DRAWINGS

A more complete understanding of the present invention may be derived by referring to the detailed description and claims when considered in connection with the drawing figures, wherein like reference numbers refer to similar elements throughout the drawing figures, and:

DETAILED DESCRIPTION

While exemplary embodiments are described herein in sufficient detail to enable those skilled in the art to practice the invention, it should be understood that other embodiments may be realized and that logical electrical and mechanical changes may be made without departing from the spirit and scope of the invention. Thus, the following detailed description is presented for purposes of illustration only.

In accordance with an exemplary embodiment of the present invention, a tunable transmitter with dual conversion architecture comprises a single tunable oscillator. The single tunable oscillator provides a local oscillator ("LO") signal to a first mixer and provides a scaled version of the LO signal to a second mixer. The first mixer upconverts an IF signal which is filtered, and the filtered signal is then upconverted in the second mixer. The output of the second mixer is an RF signal. The RF signal may be transmitted via an antenna, for example. Although described herein in the embodiment of a transmitter, similar techniques may be used in the context of a transceiver.

Figure 2A:
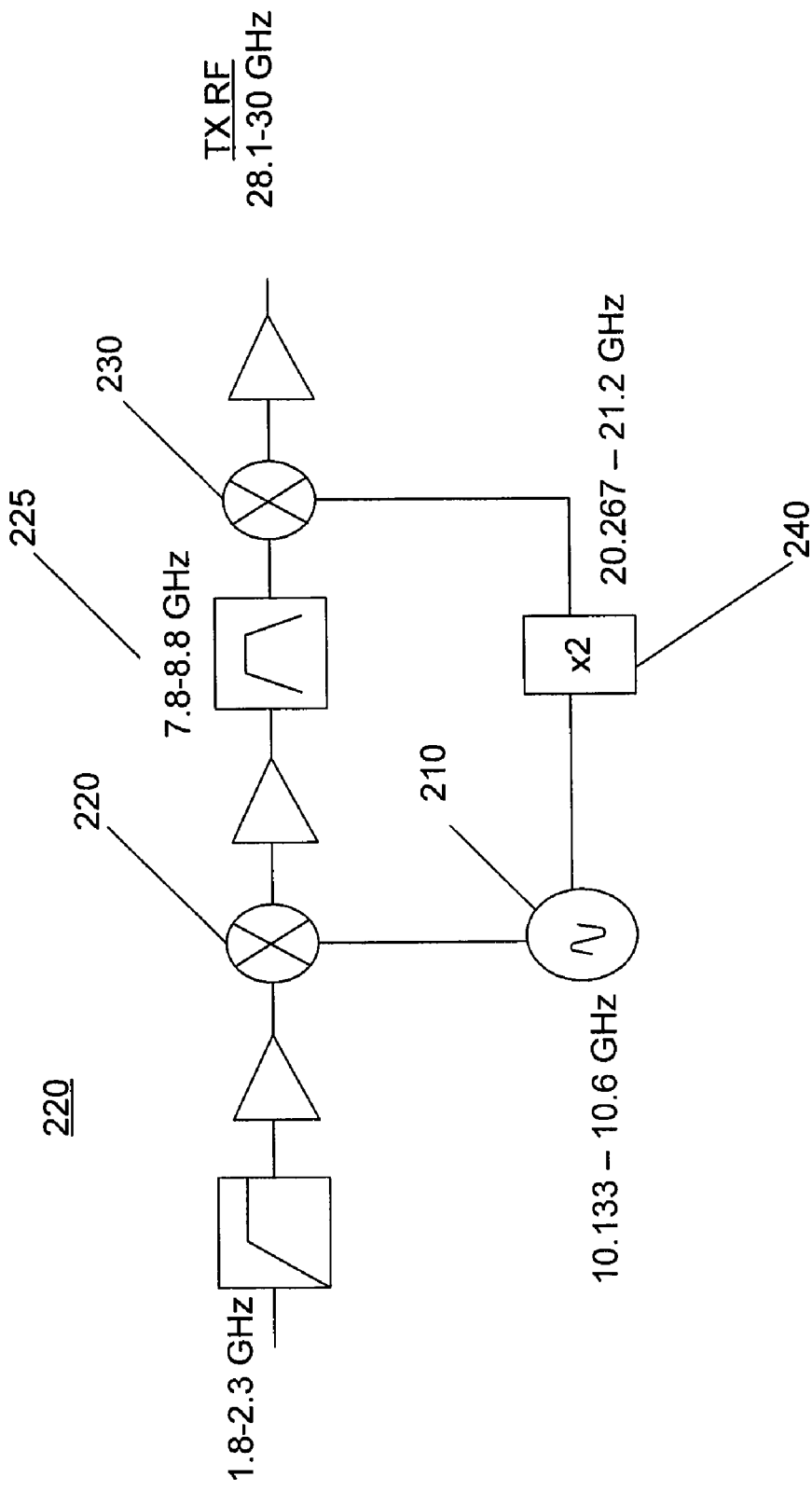
FIG. 2A illustrates an exemplary dual conversion transmitter comprising a single tunable oscillator.
Figure 2B:
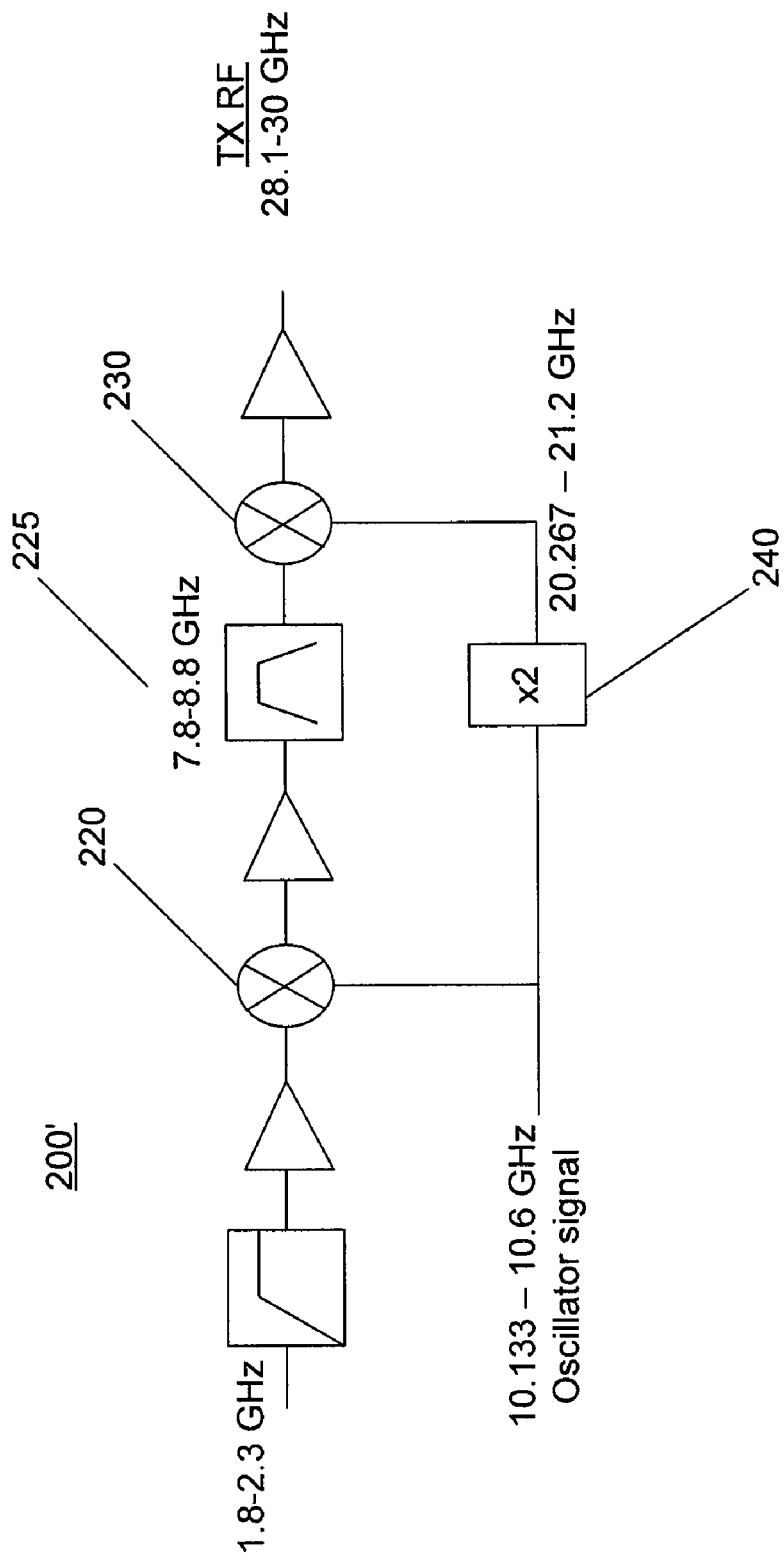
FIG. 2B illustrates an exemplary dual conversion transmitter comprising a single tunable oscillator signal.

With reference now to FIGS. 2A and 2B, in an exemplary embodiment, a tunable dual conversion transmitter 200 comprises a tunable oscillator 210. Tunable dual conversion transmitter 200 may further comprise a first mixer 220, a filter 225, a second mixer 230, and a multiplier 240. Tunable oscillator 210 is configured in electrical communication with first mixer 220 and multiplier 240. Mixer 220 is configured in electrical communication with filter 225. Second mixer 230 is in electrical communication with filter 225 and multiplier 240. Furthermore, additional electronic components such as filters, amplifiers, and/or the like, may be added to tunable dual conversion transmitter 200.

In accordance with an exemplary embodiment, tunable oscillator 210 is configured to provide an LO signal to first mixer 220 and to multiplier 240. In an exemplary embodiment, the LO signal is tunable. Furthermore, tunable oscillator 210 may be any suitable tunable oscillator that is configured to generate an oscillating reference signal.

The LO signal may, for example, be the fundamental frequency of tunable oscillator 210. In various exemplary embodiments, the single tunable oscillator has a lower fundamental frequency operating range than that of a tunable oscillator in an otherwise similar multiple oscillator dual conversion transmitter. Although the frequencies shown in the figures are only illustrative and any appropriate frequencies may be used, it is useful to compare the LO frequency range associated with FIG. 1A to the LO frequency range associated with FIGS. 2A and 2B. There it can be seen that the design constraints required a larger LO frequency range (9.8-11.2 GHz) for the tunable oscillator in the multiple oscillator tunable transmitter than for the single oscillator that has a LO frequency range of 10.133-10.6 GHz. Although the design frequencies may be different in different embodiments, in general the LO tunable frequency range can be smaller in the single oscillator design than in a multiple oscillator design. In the example above, the LO has a tunable range of 1.4 GHz in the multiple oscillator tunable transmitter as opposed to 467 MHz in the single oscillator tunable transmitter. Thus, in an exemplary embodiment, the frequency range may be one third smaller than a tunable oscillator in an otherwise similar tunable transmitter that has multiple oscillators. In other exemplary embodiments, the frequency range may be even more than ⅓ smaller. In exemplary embodiments, with reference to FIGS. 9A and 9B, the frequency range may be smaller by an amount shown in the following equation:

$$OTR = BW1 \left( \frac{1}{1 + \sum_{i=1}^{N} M_i} \right)$$

where BW1 is the frequency range of a transmitter with multiple oscillators, OTR is the oscillator tuning range, and $M_i$ is the multiplication factor of each multiplier from stage 1 through N.

In accordance with various exemplary embodiments, LO 210 is a less expensive LO than a tunable oscillator in an otherwise similar tunable transmitter that has multiple oscillators. Not only can a lower frequency oscillator be used, less parts also results in lower material, manufacturing costs and higher reliability. Also, given the small IF filter passband, in this example 7.8-8.8 GHz, filtering spurious signals may be more easily accomplished. Traditional approaches have an IF passband that is a much higher percentage bandwidth than the other passbands. Phase noise is improved as the LO is designed at a lower frequency and has a lower tune range. When compared to the prior art shown in FIG. 1A, the exemplary embodiment shown in FIGS. 2A and 2B has better overall phase noise due to the lower tune range in the single oscillator system. Oscillator phase noise performance is indirectly proportional to the tuning range of the VCO. Phase noise at the output of the multiplier is degraded from the initial oscillator phase noise by 20 log(N). This is true if a multiplier is used as well as when an oscillator is designed at M times the initial frequency. In one exemplary embodiment, with reference to FIGS. 2A and 2B, the phase noise degradation may be as little as 7 dB versus 9.5 dB for the prior art shown in FIG. 1B. Phase noise reduction in the exemplary embodiment, with reference to FIGS. 2A and 2B, occurs because the noise power of the LO 210 is added to the output of the multiplier 240. In the prior art, with renewed reference to FIG. 1B, the phase noise is degraded by the multiplier which must be larger than an exemplary multiplier, with renewed reference to FIGS. 2A and 2B, to achieve the same output frequency. The equations below show the approximate phase noise degradation in both cases:

Phase Noise Degradation, with reference to FIGS. 2A and 2B:

$$P_{tot} = 10\log\left(10^{\frac{P1}{10}} + 10^{\frac{P2}{10}}\right)$$

$$P2 = P1 + 20\log(2) \cong P1 + 6$$

$$P_{tot} = 10\log\left(10^{\frac{P1}{10}} + 10^{\frac{P1+6}{10}}\right)$$

$$P_{tot} = 10\log\left(10^{\frac{P1}{10}} + 10^{\frac{P1}{10}}\left(10^{\frac{6}{10}}\right)\right)$$

$$P_{tot} = 10\log\left(10^{\frac{P1}{10}}\left(1 + 10^{\frac{6}{10}}\right)\right)$$

$$P_{tot} = 10\log\left(10^{\frac{P1}{10}}(1+4)\right) = 10\log\left(5\left(10^{\frac{P1}{10}}\right)\right)$$

$$P_{tot} = 10\log(5) + 10\log\left(10^{\frac{P1}{10}}\right) = 7 + 10\left(\frac{P1}{10}\right)\log(10)$$

$$P_{tot} = P1 + 7$$

Figure 1:
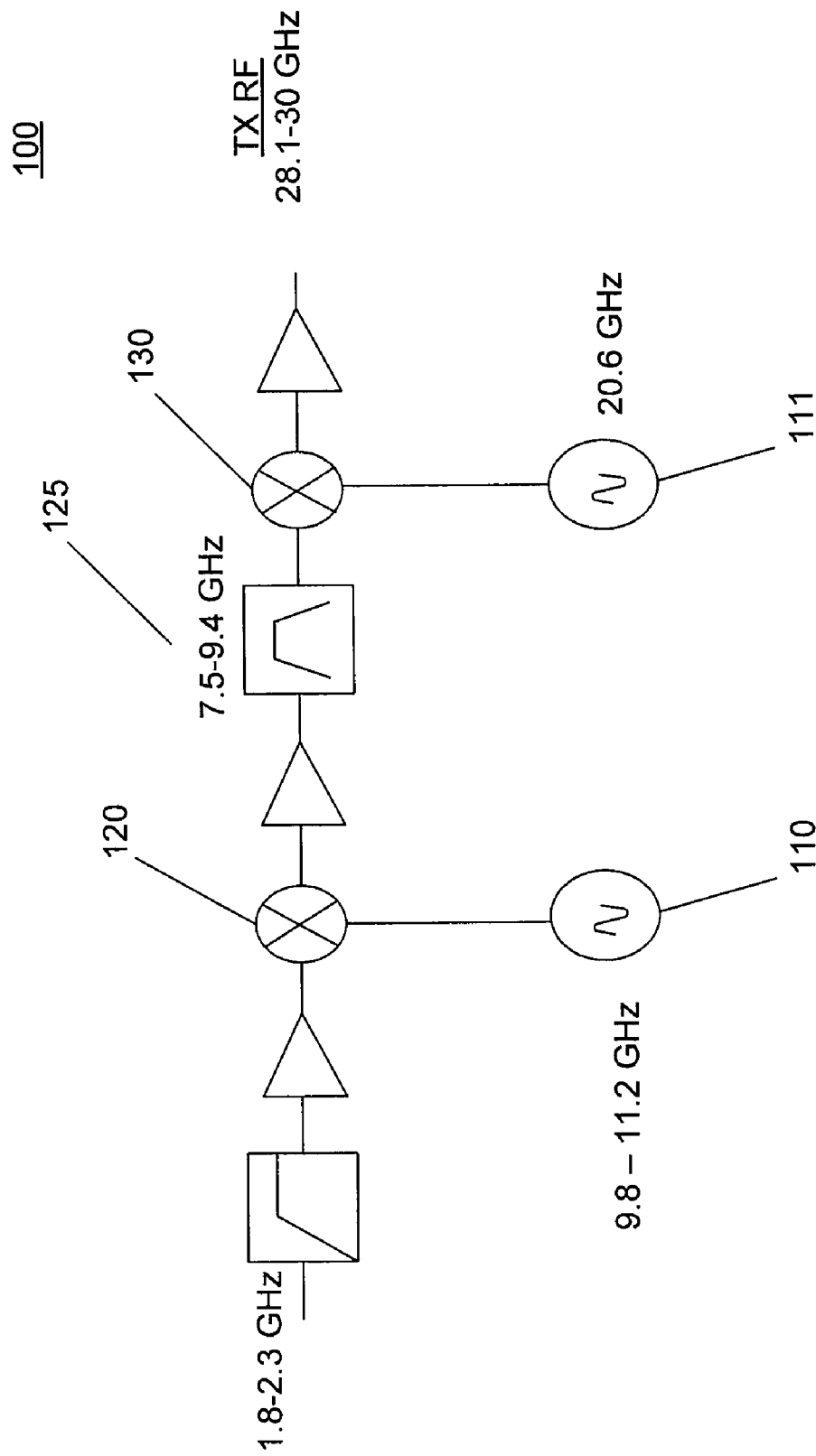
FIG. 1A illustrates a prior art multiple local oscillator dual conversion transmitter.
FIG. 1B illustrates a prior art local oscillator transmitter.
Figure 1B:
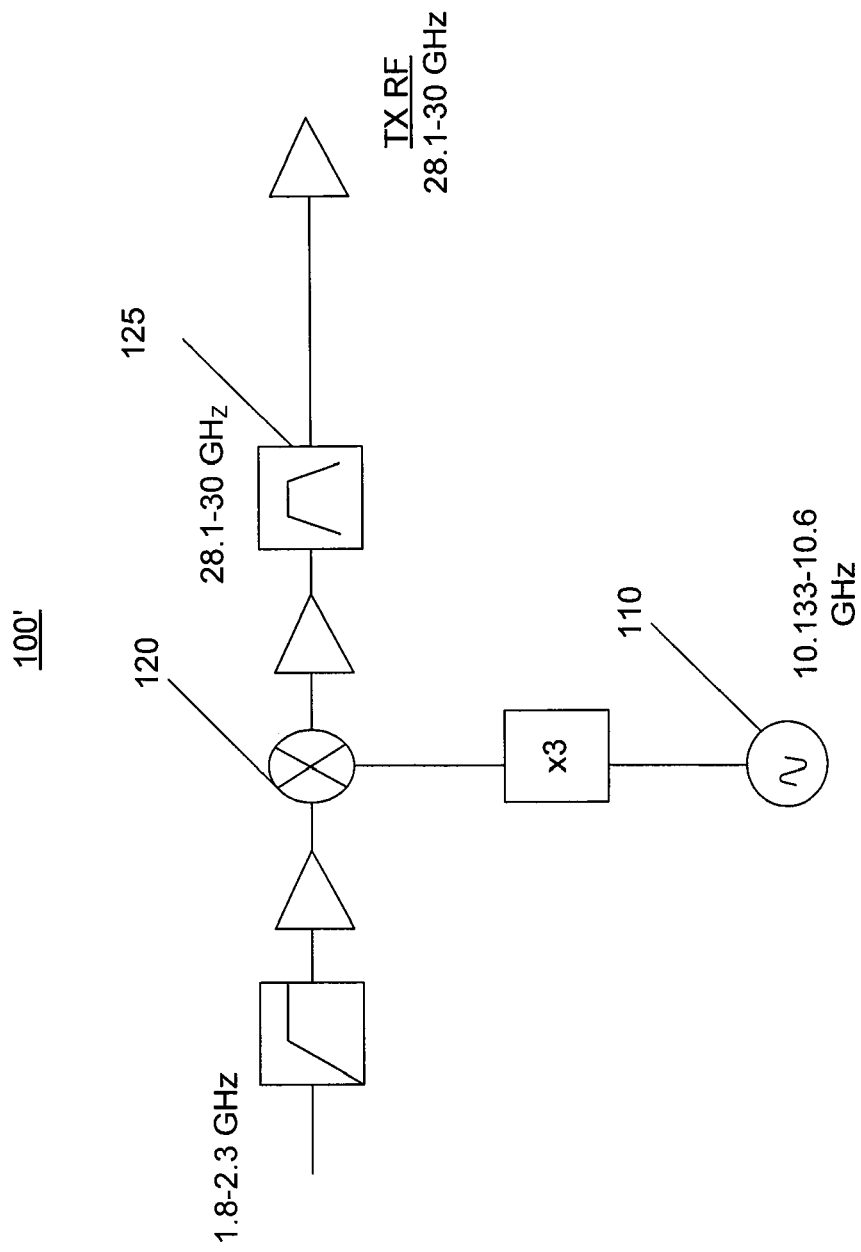

Phase Noise Degradation, with reference to FIG. 1B:

$$P2 = P1 + 20\log(3) \cong P1 + 9.5$$

In other exemplary embodiments, the "single oscillator" may be phase locked to a crystal reference or other oscillator. In accordance with further exemplary embodiments, and with reference to FIG. 2B, the "single oscillator" may simply comprise a single oscillator signal. In this regard, the "single oscillator" may be off chip and the signal fed onto the chip. This embodiment is still different from the prior art (see, for example FIG. 1A) which would involve two different oscillator signals (from oscillators 100, 111) instead of one, where the first oscillator signal was tunable (i.e., from a tunable source) and second oscillator signal was not.

In accordance with an exemplary embodiment, multiplier 240 is an active doubler. Multiplier 240 may be configured to receive the LO signal from oscillator 210 and to provide an oscillating signal to second mixer 230, where the signal provided to the second mixer is a multiple of the LO signal from oscillator 210. For example, multiplier 240 may provide a signal to second mixer 230 at two times the fundamental frequency of oscillator 210. Furthermore, multiplier 240 may comprise any component that scales a signal.

In various exemplary embodiments a frequency multiplier may be used to multiply the base frequency of the oscillator by a predetermined integer. This multiplied frequency may be amplified, mixed with other signals and sent to the final drive stage and into the antenna tuning/coupling circuit for delivery to a transmitting antenna.

It should be understood that a combination of multipliers may be used in the place of a single multiplier 240 to obtain the same effect. Furthermore, in other exemplary embodiments, relative scaling may be used on both the signal to first mixer 220 and to second mixer 230. For example, the LO frequency could be half that shown in the exemplary embodiment described with reference to FIGS. 2A and 2B, and a 2× multiplier could be used between single oscillator 210 and first mixer 220, with a 4× multiplier used between single oscillator 210 and second mixer 230. This would provide a similar result as in the example described above with respect to FIGS. 2A and 2B. In other exemplary embodiments, it is noted that a multiplier could also be used between oscillator 210 and mixer 220. Moreover, it is possible to use a divider in place of a multiplier. Nevertheless, generally speaking to get the benefit of spurious suppression and the gradual bandwidth expansion as you move through the chain of mixers, the LO signal supplied to the mixers will be supplied in ascending order of frequency from one mixer to the next in the direction of the output. In various exemplary embodiments, the present device is able to use a smaller percentage bandwidth at the intermediate frequencies than the prior art.

In general, the filter bandwidth at the output of each mixer in the conversion chain is wider than the input bandwidth. This is the case because the LO moves in frequency for all the conversions. In addition, the full desired operating bandwidth is not achieved at the first conversion and indeed not until the final mixer conversion. In contrast, the prior art solution FIG. 1A would have the same bandwidth before and after mixer 130 and in the case of prior art FIG. 1B the full final bandwidth is achieved at the first mixer making the filtering difficult or potentially impossible with a single fixed filter. The advantage of the gradual expansion of the operating bandwidth as the signal moves through the upconversion chain is that filtering can be done at each intermediate frequency allowing spurious products to be rejected more easily with a single fixed filter at each location. The more upconversion steps that are included means the bandwidth expands even more gradually and the spurious products are even easier to filter because there is more frequency separation between the desired operating band and the spurious rejection frequencies.

In another exemplary embodiment, the scaling may be accomplished in the mixers. For example, multiplier 240 and second mixer 230 may be combined in a sub-harmonic mixer and achieve the same objects as described herein. In accordance with an exemplary embodiment, mixer 220 and mixer 230 may be part of a Gilbert Cell Mixer. Mixers 220, 230, however, may be part of any suitable component that is configured to receive an input signal having a first frequency and to receive a tunable local oscillator signal, and to output a converted signal having a second frequency. More specifically, in an exemplary embodiment, mixers 220, 230 may comprise any device that is configured to up-convert an input signal based on an oscillator signal.

In various exemplary embodiments, the mixer may be a nonlinear or time-varying circuit or device that accepts as its input two different frequencies and presents at its output a mixture of signals at several frequencies. These frequencies may include: (1) the sum of the frequencies of the input signals; (2) the difference between the frequencies of the input signals; (3) both original input frequencies—these are often considered parasitic and are filtered out in subsequent filter stages; and/or (4) unwanted intermodulation products from the inputs. A balanced mixer passes a small leakage of the original signal to the output, often implemented as a double balanced mixer which has high isolation of both inputs. Nonlinear effect can be created by using a nonlinear electrical component, such as a diode. The time-varying effect can be created using a multiplier circuit such as a Gilbert Cell or passive switches. The manipulations of frequency performed by a mixer can be used to move signals between bands, or to encode and decode them. As mentioned above, one or both mixers 220, 230 may comprise sub-harmonic mixers. The output signal may be amplified, combined with other signals and/or sent to the final drive stage and into the antenna tuning/coupling circuit for delivery to a transmitting antenna.

In accordance with an exemplary embodiment, filter 225 is configured to receive the converted signal from first mixer 220, to band pass filter the converted signal, and to pass that filtered signal on to second mixer 230. In an exemplary embodiment, the selection of the filter properties is directly related to the use of a single tunable oscillator. For example, use of multiple oscillators in a tunable dual conversion transmitter results in a wider band width signal to be filtered. This generally causes it to be more difficult to design the filter. Moreover, in the prior art multiple oscillator transceiver, the filter is generally less effective because in such a system, the spurious mixer outputs are closer to the desired band. In fact, in some prior art embodiments, the spurious mixer outputs may be in the passband of the filter making it impossible to filter them out without a more complex system such as a filter bank. Moreover, such difficulties in the prior art may constrain the frequencies that can be used with such a transmitter.

In accordance with an exemplary embodiment, however, use of a single tunable oscillator signal (as opposed to one tunable oscillator and a separate fixed frequency oscillator) may facilitate use of a smaller bandwidth filter. For example, the bandwidth of filter 125 in prior art FIGS. 1A&1B are 7.5-9.4 GHz and 28.1-30.0 GHz respectively (a 1.9 GHz bandwidth) whereas the bandwidth of filter 225 in FIG. 2, is 7.8-8.8 GHz (a 1.0 GHz bandwidth). This is a 50% reduction in bandwidth compared to the prior art filters. Moreover, in exemplary embodiments, as the tunable oscillator is tuned to higher frequencies, the passband of the filter can remain constant and still remove spurs.

In contrast, the use of a single tunable oscillator makes it easier to design the filter. In one exemplary embodiment, a single filter can be used instead of a bank of switchably selected filters. Thus, in an exemplary embodiment, a tunable transmitter comprises a filter having a bandwidth of 1 GHz and that does not comprise a bank of switchably selected filters. In another exemplary embodiment, fewer filters can be used in a bank of switchably selected filters as compared to the number of filters that would be needed to achieve similar performance results in a multiple oscillator tunable transmitter.

In accordance with an exemplary embodiment, mixer 230 is configured to receive the output of filter 225 and to receive a scaled version of the signal from oscillator 210, and is configured to output a converted signal.

Thus, in accordance with an exemplary embodiment, a single, tunable oscillator is used in a dual conversion transmitter such that the first upconversion uses the LO fundamental frequency and the second (or subsequent) upconversion(s) uses a multiple of the LO fundamental frequency. Some benefits of using a single LO in a dual conversion architecture (as opposed to multiple LO's) include:

1. Reduces the IF bandwidth making spurious signals (spurs) easier to filter;
2. Reduces the range the LO has to tune making the oscillator easier to design;
3. Improves phase noise because the LO has a lower tune range;
4. Lower material costs due to the elimination of the second oscillator; and
5. Easier to manufacture since filters do not need to be as tightly controlled.

In accordance with various exemplary embodiments, this architecture is advantageous because it facilitates designing transmitter devices in SiGe, as well as in other processes with high variation. Silicon-germanium, is a general term for the alloy $Si_{1-x}Ge_x$, which consists of any molar ratio of silicon and germanium. It is commonly used as a semiconductor material in integrated circuits (ICs) for heterojunction bipolar transistors or as a strain-inducing layer for CMOS transistors. SiGe offers opportunities in mixed-signal circuit and analog circuit IC design and manufacture. SiGe allows CMOS logic to be integrated with heterojunction bipolar transistors, making it suitable for mixed-signal circuits. Heterojunction bipolar transistors have higher forward gain and lower reverse gain than traditional homojunction bipolar transistors. In some embodiments, this translates into better low current and high frequency performance. Being a heterojunction technology with an adjustable band gap, the SiGe offers the opportunity for more flexible band gap tuning than silicon-only technology.

Typically, when designing devices in structures such as SiGe that have a relatively high process variation, the design provides appropriate tolerances to account for variation in the performance of the device (from device to device). However, this can be a considerable design limitation, if not an overriding limitation, if working with certain design limitations. In particular in designing transmitters in the Ka, Ku, and similar high frequency ranges, the design limitations make it difficult to also provide for the process variation associated with SiGe when using the prior art solutions. In contrast, by using a single tunable oscillator in a dual conversion transmitter, the filter design and oscillator design becomes simpler.

Use of a single tunable oscillator in a dual conversion transmitter also facilitates integrating more of the transmitter device into the chip. Due to these higher levels of integration, the products can be made smaller, with less placement of parts, with greater robustness and repeatability, and at less expense. The use of fewer oscillators lowers the material costs, but the use of lower frequency oscillators also lowers the material costs.

In high frequency applications, and in particular, in applications where the transmitter is transmitting at low, medium, and high frequencies, phase noise can be a significant issue at those high frequencies. It has been determined that the phase noise at higher frequencies is worse in a multiple oscillator dual conversion transmitter than for a single oscillator dual conversion transmitter, where both transmitters have similar inputs and otherwise similar design criteria. This is in part because of the wider frequency bandwidth of the tunable local oscillator in the multiple oscillator dual conversion transmitter than in the single oscillator dual conversion transmitter. Similarly, the single oscillator does not have the phase noise associated with the higher frequency second oscillator 111 (e.g., at 20.6 GHz). These factors tend to improve phase noise in the single oscillator embodiment over a multiple oscillator embodiment.

In an exemplary embodiment, the second mixer uses the second harmonic of the first mixer, and therefore some of the tuning can be done with each upconversion. This not only reduces the range the LO has to tune but also allows some of the IF bands to overlap, thus easing the filter requirements. In an exemplary embodiment, three IF bands are transmitted by dual conversion transmitter 200: a low band, a mid-band, and a high band. FIGS. 3-6 show how each of the three bands is upconverted using this architecture and how the IF bands overlap.

Figure 3:
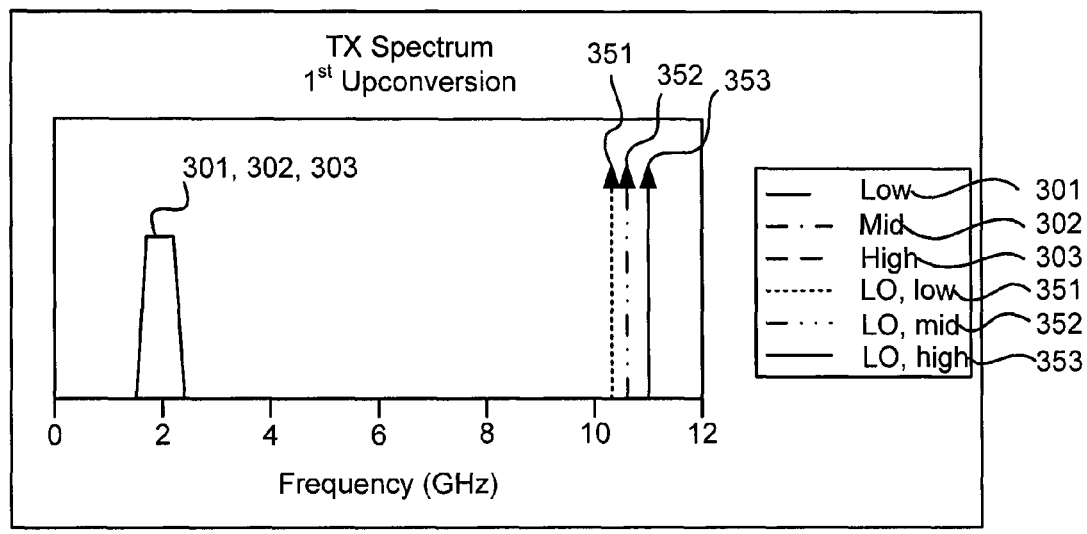
FIG. 3 illustrates an exemplary spectrum associated with mixer 1, in accordance with an exemplary embodiment.
Figure 4:
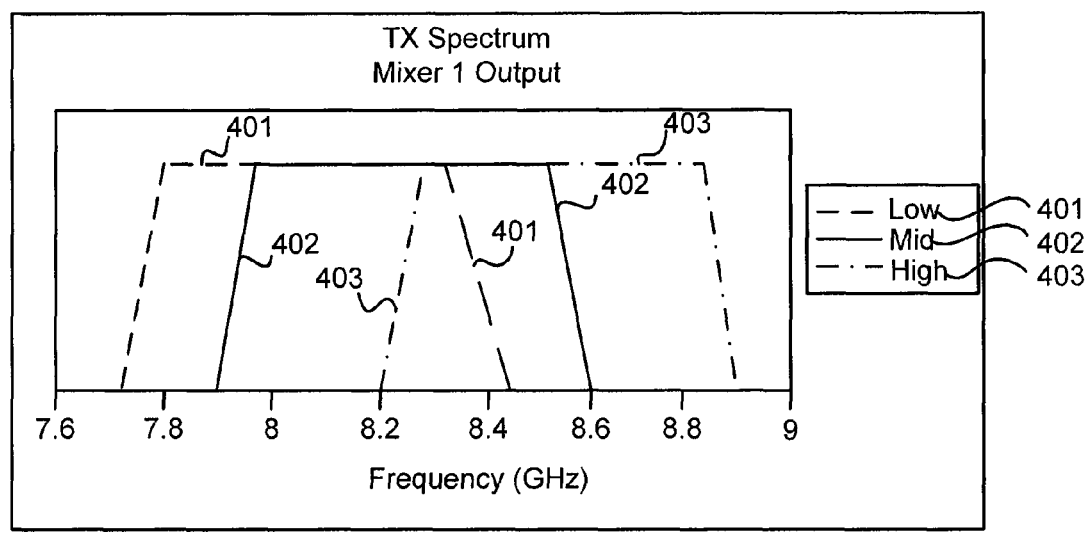
FIG. 4 illustrates an exemplary output of mixer 1, in accordance with an exemplary embodiment.

With reference now to FIG. 3, an exemplary transmit spectrum of the inputs to the first mixer 220 of FIG. 2 is illustrated. The IF input spectrum is depicted by 301, 302, and 303 and the Lo input is depicted by 351, 352, and 353 for the low, mid, and high frequencies, respectively. For this scenario, an exemplary output spectrum is illustrated in FIG. 4. The first mixer output spectrum is depicted by 401, 402, and 403 for the low, mid, and high frequencies respectively. As can be observed, the mixer 1 output bands overlap resulting in less required filter bandwidth and fits within the bandpass frequencies of filter 225.

Figure 5:
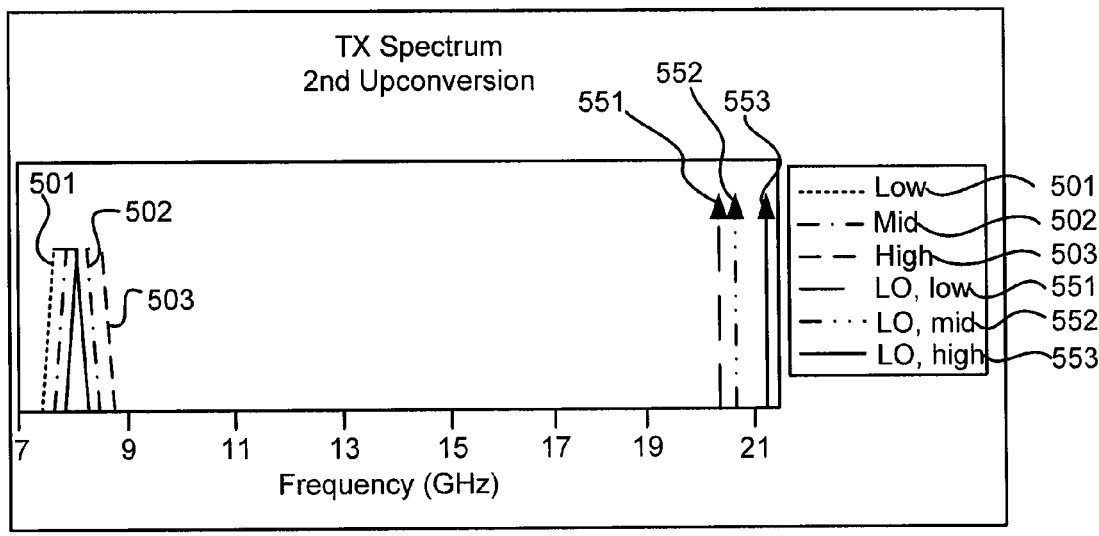
FIG. 5 illustrates an exemplary spectrum associated with mixer 2, in accordance with an exemplary embodiment.
Figure 6:
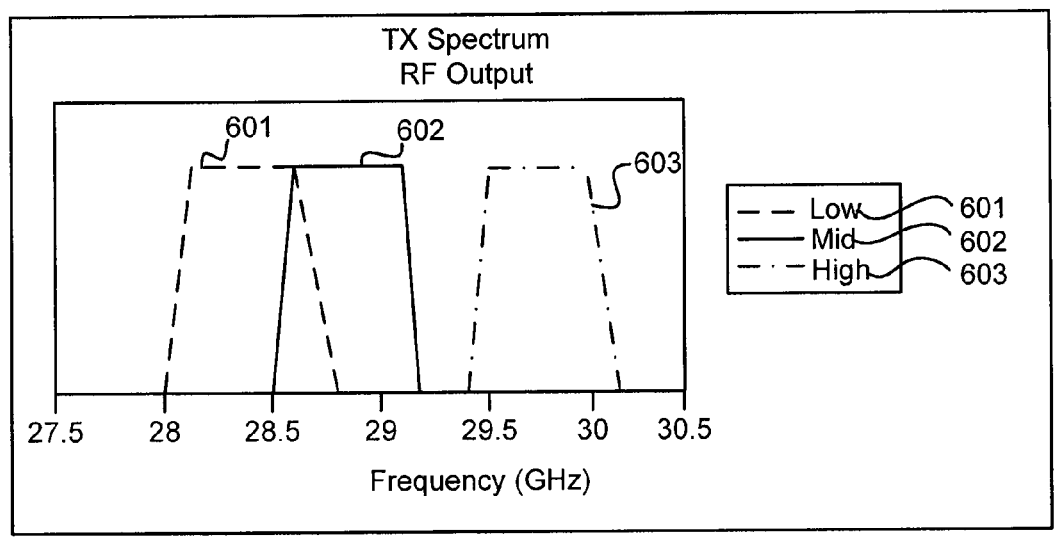
FIG. 6 illustrates an exemplary output spectrum of mixer 2, in accordance with an exemplary embodiment.

With reference now to FIG. 5, an exemplary transmit spectrum of the inputs to the second mixer 230 of FIG. 2 is illustrated. The IF input spectrum is depicted by 501, 502, and 503 and the Lo input is depicted by 551, 552, and 553 for the low, mid, and high frequencies from the output of multiplier 240, respectively. For this scenario, an exemplary output spectrum is illustrated in FIG. 6. The second mixer 230 output spectrum is depicted by 601, 602, and 603 for the low, mid, and high frequencies respectively. As can be observed, the mixer 230 output are within the desired 28.1-30 GHz suitable for the example associated with FIG. 2.

In one exemplary embodiment, a multiple conversion transmitter may include (1) a power splitter configured to receive an oscillator signal and to divide the oscillator signal into first and second signals; and (2) a first multiplier configured to receive the first signal and to scale the frequency of the first signal to create a first scaled signal. In one exemplary embodiment, the frequency of the first scaled signal and the frequency of the second signal may not be equal to each other. The first scaled signal may be used for frequency conversion in a second mixer of the transmitter. The second signal may be used for frequency conversion in a first mixer of the transmitter. An output of the first mixer may be filtered to create a filtered output. The filtered output may be input to the second mixer. The multiple conversion transmitter may include an oscillator.

Figure 7A:
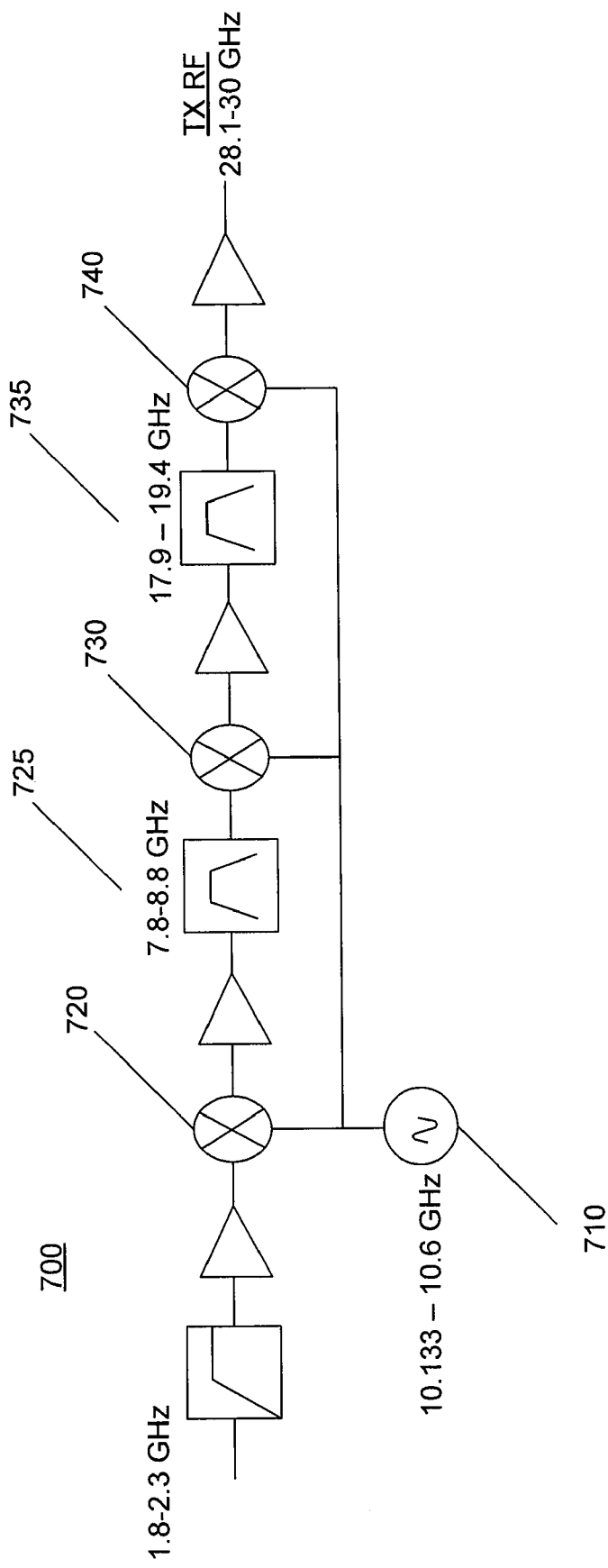
FIG. 7A illustrates an alternative exemplary dual conversion transmitter comprising a single tunable oscillator, in accordance with an exemplary embodiment.
Figure 7B:
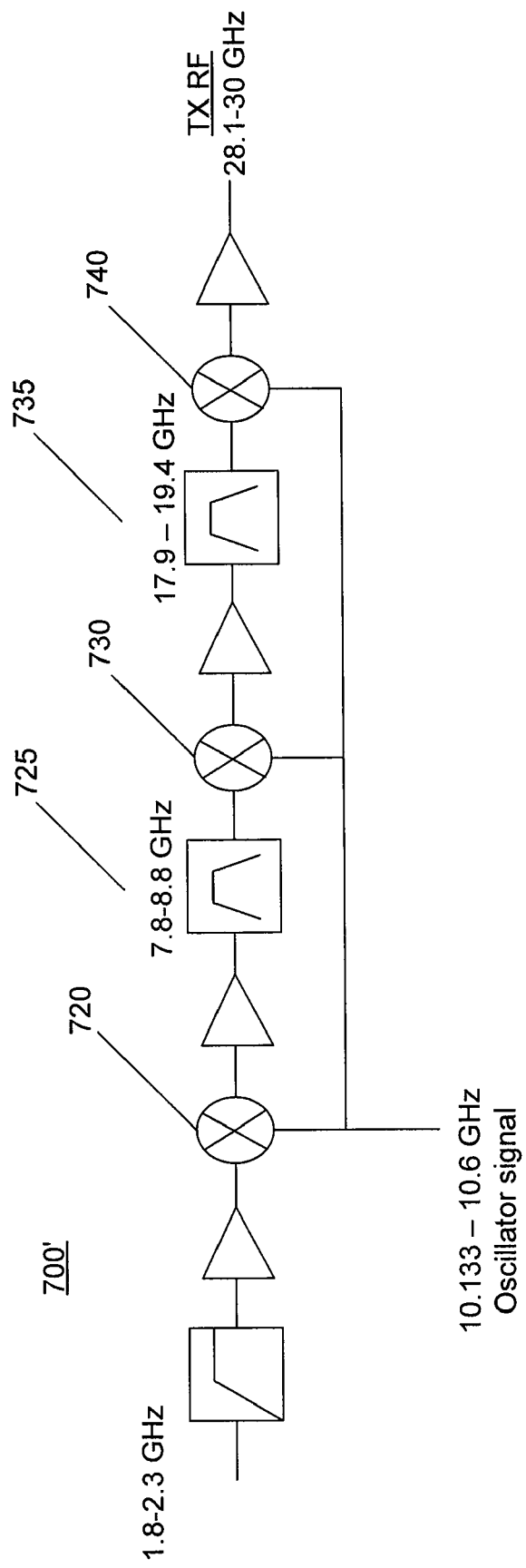
FIG. 7B illustrates an alternative exemplary dual conversion transmitter comprising an oscillator signal, in accordance with an exemplary embodiment.

In various exemplary embodiments, referring to FIGS. 7A and 7B, filter 725 is configured to receive the converted signal from first mixer 720, to band pass filter the converted signal, and to pass that filtered signal on to second mixer 730. Next, filter 735 is configured to receive the converted signal from second mixer 730, to band pass filter the converted signal, and to pass that filtered signal on to third mixer 740. Tunable oscillator 710 is configured to provide a LO signal to mixers 720, 730 and 740.

Although the frequencies shown in the figures are only illustrative and any appropriate frequencies may be used, it is useful to compare the LO frequency range for FIG. 1A and for FIGS. 7A and 7B. There it can be seen that the design constraints required a larger LO frequency range (9.8-11.2 GHz, for a total of 1.4 GHz) for the tunable oscillator in the multiple oscillator tunable transmitter than for the single oscillator that has a LO frequency range of 10.133-10.6 GHz. Although the design frequencies may change, the principle is generally true that the LO tunable frequency range can be smaller in the single oscillator design than in a multiple oscillator design. Thus, in an exemplary embodiment, the frequency range may be one third smaller than a tunable oscillator in an otherwise similar tunable transmitter that has multiple oscillators. In other exemplary embodiments, the frequency range may be even more than ⅓ smaller. In exemplary embodiments, the frequency range may be smaller by an shown in the following equation:

$$OTR = BW1\left(\frac{1}{1 + \sum_{i=1}^{N} M_i}\right)$$

where BW1 is the frequency range of a transmitter with multiple oscillators, OTR is the oscillator tuning range and $M_i$ is the multiplication factor of each multiplier from stage 1 through N.

Also, given the small IF filter passband, in this example 1 Ghz, (7.8-8.8 GHz) and 1.5 GHz (17.9-19.4 GHz) for filters 725 and 735, respectively, filtering spurious signals may be more easily accomplished. The IF passband of the filter(s), such as filters 725, and 735 is a much lower percentage of bandwidth than multiple oscillator approaches. Phase noise is improved as the LO is designed at a lower frequency and has a lower tune range. In one exemplary embodiment, with reference to the examples of FIGS. 7A and 7B, the phase noise degradation may be as little as 10 log(3)=4.77 dB compared to a 20 log(3)=9.5 dB degradation for a single conversion system in which the same LO source is used with an LO ×3 multiplier.

In accordance with other exemplary embodiments, FIG. 1B also has the drawback of higher phase noise than an exemplary system that does not have a single tunable oscillator/oscillator signal. Also, it is noted that the filter has to filter across a large frequency range equal to the frequency range of the output of transceiver 700.

In various exemplary embodiments, mixer 730 uses a harmonic of the fundamental oscillator signal 710, and therefore some of the tuning can be done with each upconversion. This not only reduces the range the LO has to tune but also allows some of the IF bands to overlap, thus easing the filter requirements.

Figure 8A:
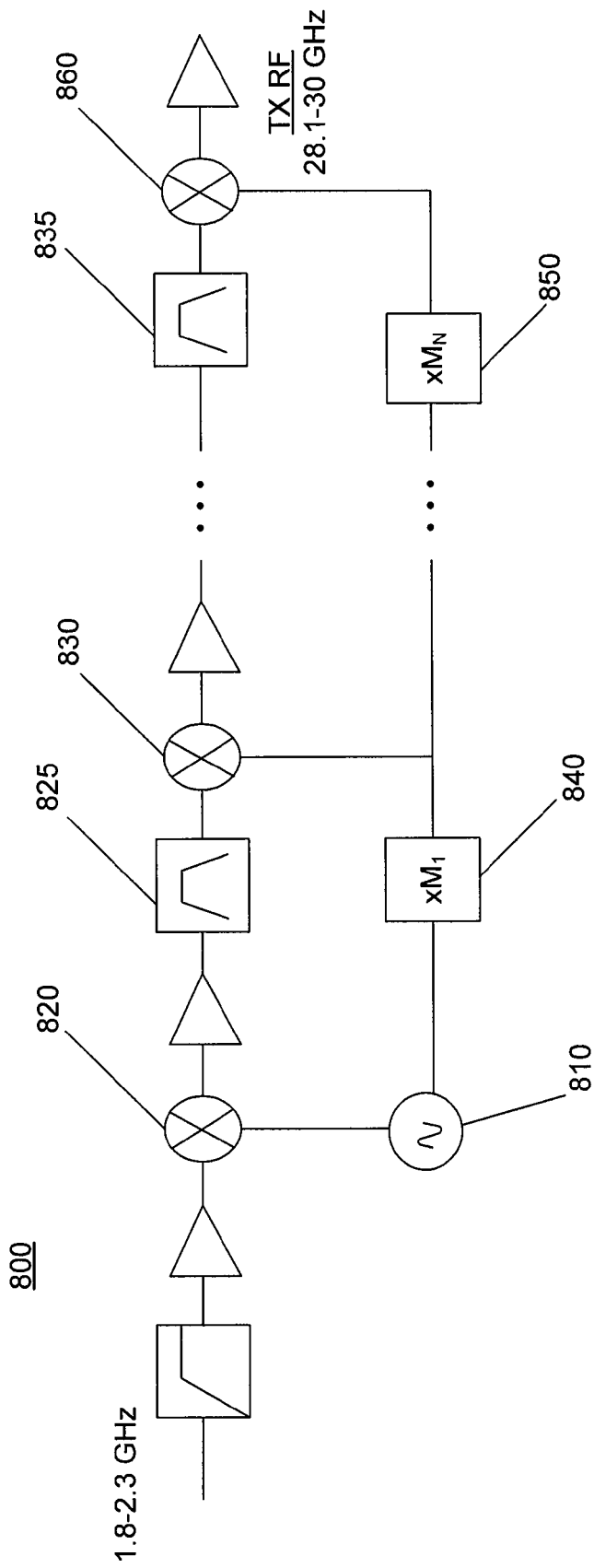
FIG. 8A illustrates another alternative exemplary dual conversion transmitter comprising a single tunable oscillator, in accordance with an exemplary embodiment.
Figure 8B:
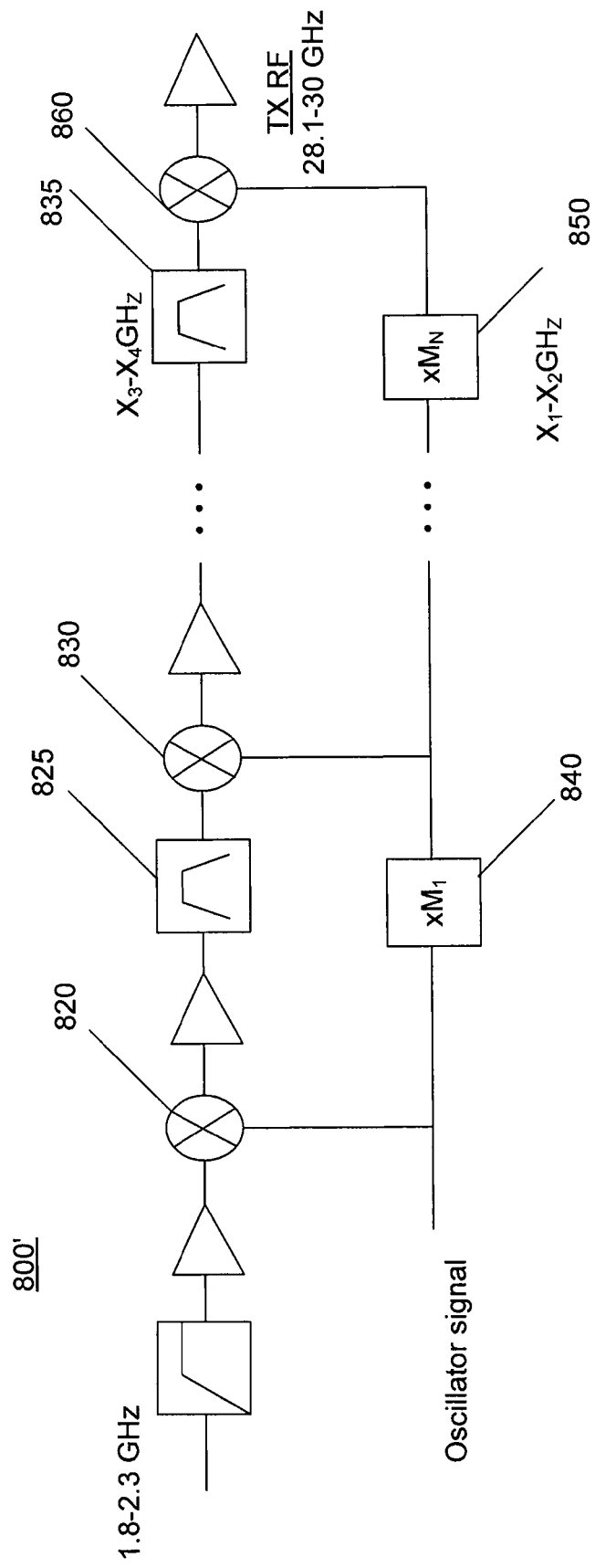
FIG. 8B illustrates another alternative exemplary dual conversion transmitter comprising an oscillator signal, in accordance with an exemplary embodiment.

Similar to the circuit example provided in FIGS. 2A and 2B, in various exemplary embodiments, referring to FIGS. 8A and 8B, an oscillator signal may be, upconverted N times with a multiplier factor of $M_1$, $M_2$, $M_3$, and so on. It should be noted that the multiplier factors $M_1$, $M_2$, $M_3$, ... $M_N$ may be the same as each other or one or all of them may be different from each other. In one exemplary embodiment, the oscillator signal may be tunable. Multiplier 840 may be configured to receive a LO signal and to provide a scaled version of the LO signal to mixer 830. Multiplier 840 may scale the LO signal by a multiplier factor of $M_1$. Filter 825 is configured to receive the converted signal from first mixer 820, to band pass filter the converted signal, and to pass that filtered signal on to second mixer 830. This process may continue N times. Then, the converted signal from N−1 mixer is provided to N mixer 860 through N filter 835. The oscillator signal provided to the N mixer 860 may be a multiple of the LO signal from $M_{N-1}$ multiplier. For example, $M_N$ multiplier 850 may provide a signal to N mixer 860 at eight times the fundamental frequency of the oscillator signal. Again, this not only reduces the range the LO can tune but also allows some of the IF bands to overlap, thus easing the filter requirements.

In an exemplary embodiment, transmitter 800 is configured such that the percentage bandwidth is held constant and therefore, each upconversion filtering is easier. However, as N gets larger, spurs will be more difficult to remove as their location will generally be located closer to the selected bandwidth of interest. There is no mathematical limit to the number of conversions that may be undergone, however there may be a practical limit. As more conversions occur, the LO frequency generally needs to be reduced. As the bandwidth expands through the chain, the LO frequency may approach a point where the LO frequency is at a value where the desired band you want to pass may not be removed. While other frequencies may be used, generally, a LO frequency of at least two times the output bandwidth for any conversion is preferred.

Figure 9A:
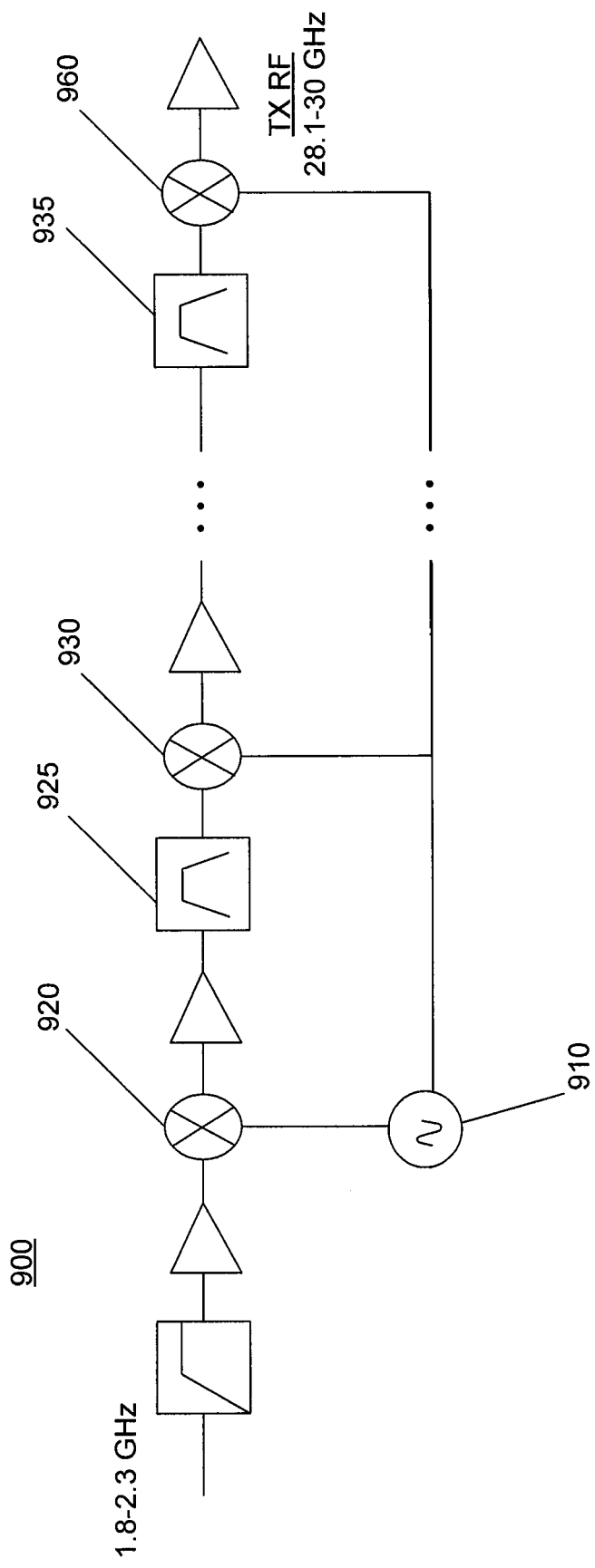
FIG. 9A illustrates yet another alternative exemplary dual conversion transmitter comprising a single tunable oscillator, in accordance with an exemplary embodiment.
Figure 9B:
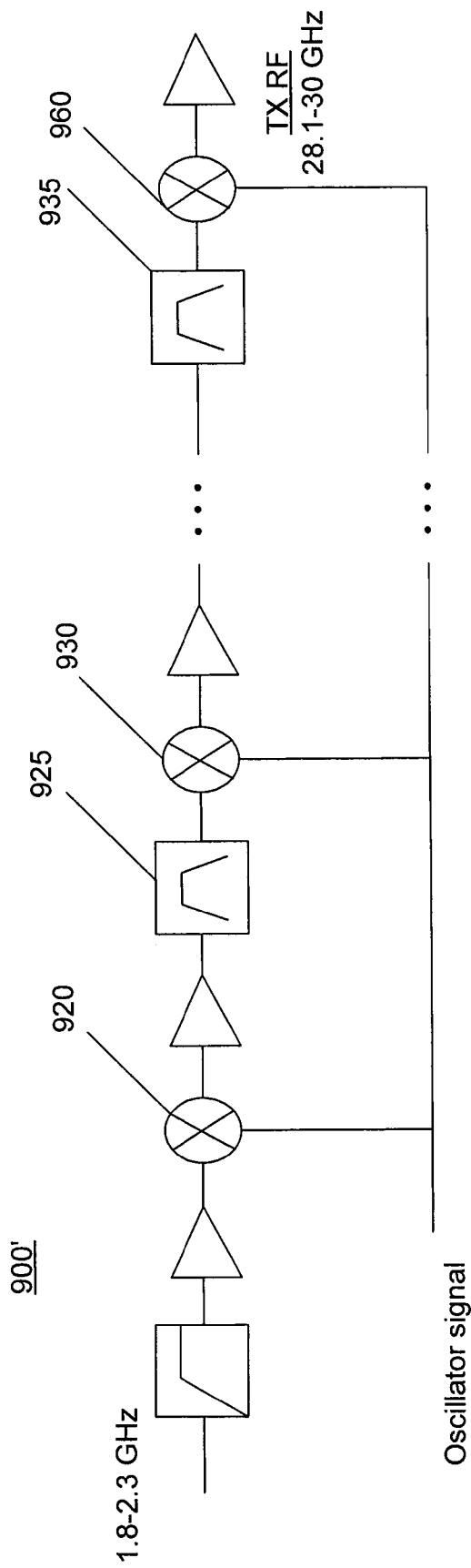
FIG. 9B illustrates yet another alternative exemplary dual conversion transmitter comprising an oscillator signal, in accordance with an exemplary embodiment.

In various exemplary embodiments, referring to FIGS. 9A and 9B, a multistage upconvertor is described that has a single oscillator/oscillator signal and only one multiplier. In an exemplary embodiment, filter 925 is configured to receive the converted signal from first mixer 920, to band pass filter the converted signal, and to pass that filtered signal on to second mixer 930. This process may continue as was described in FIGS. 7A and 7B for multiple additional mixers and filters. Finally, Nth filter 935 is configured to receive the converted signal from the N−1th mixer, to band pass filter the converted signal, and to pass that filtered signal on to Nth mixer 960. Tunable oscillator 910 is configured to provide a LO signal to mixers 920, 930 and 960. In an exemplary embodiment mixer 930 through 960 use a harmonic of the fundamental oscillator signal.

In various exemplary embodiments, because the designs are not pushing the limits of the tolerances of the SiGe material, tunable single oscillator dual conversion transmitters will be less likely to have products that fail testing, thus reducing the reject rate as compared to dual conversion transmitters using multiple oscillators.

Moreover, in an exemplary embodiment, a transceiver incorporating the multiple conversion, single oscillator configurations described herein within the transmit portion may further use a similar configuration or portion of a configuration in the receive portion. Alternatively, the receive portion may be implemented using a single mixer or any other suitable configuration.

In various exemplary embodiments, the transceiver system is self correcting. Since the RF receive signal is known to be a stable frequency and/or set of frequencies that do not experience drift, the local oscillator and/or local oscillator signal (used by both the transmit portion and the receive portion of the transceiver) can be allowed to be relatively unstable (e.g. experience drift, be a free running local oscillator, and/or experience astable mode operation) as long as the error of the transmit LO and receive LO are correlated the transmit frequency error can be corrected by measuring the receive error. Thus, a relatively inexpensive oscillator having an output with less stringent tolerances may be implemented.

Stated another way, in accordance with an exemplary embodiment, a self correcting transceiver system may comprise any transceiver system where the oscillator signal to the transmit portion and the oscillator signal to the receive portion are allowed to drift—so long as the transmit error and the receive error are correlated or have a known relationship. In one exemplary embodiment, the correlation or known relationship arises due to the transmit and receive oscillator signals being derived off the same free running oscillator. In another exemplary embodiment, the correlation or known relationship arises when the transmit and receive oscillator signals are phase locked to the same reference oscillator which is allowed to drift.

In accordance with an exemplary embodiment, the LO signal is mixed with the RF receive signal in the receive portion to create an IF receive signal. The IF receive signal may be provided to, for example, a modem. In one exemplary embodiment, the modem may comprise a frequency correction component. In another exemplary embodiment, the frequency correction component may be located in any suitable location. In accordance with an exemplary embodiment, the frequency correction component is configured to detect if the IF receive signal has drifted from an expected base frequency.

In one exemplary embodiment, the RF carrier frequency is known to be accurate based on the stable satellite LO frequency reference. In one exemplary embodiment, the receive IF frequency error can be assumed to be entirely due to the transceiver LO drift. A comparison the receive IF frequency with a reference, such as a known and accurate modulation symbol rate, may result in determination of the LO error. In an alternative embodiment, the receive IF frequency may be compared to the known accurate receive RF frequency to determine the LO error. However, the RF frequency is much higher and thus more difficult to measure.

In one exemplary embodiment, the transceiver is configured to use two known frequency references to facilitate frequency correction. The first is the receive RF carrier frequency, which is accurate due to the high stability of the satellite LO. The second is the modulation symbol rate (i.e., the data rate), which is sent from the hub at a very accurate known rate. In this exemplary embodiment, a frequency reference is created using the modulation symbol rate as one known frequency reference. This frequency reference may then be compared to the receive IF frequency reference. The difference between the two may be identified as an error amount. This error is assumed to all be from the transceiver LO drift. This assumption is a reasonable approximation for a first order analysis.

In another exemplary embodiment, the transceiver is again configured to use two known frequency references. The first is an accurate frequency reference in the indoor unit and the second is the modulation symbol rate. A comparison of these two frequency references can be used to create a detected error that may be assumed to be related to the transceiver LO drift.

If the IF receive signal exhibits drift, that drift must be due to drift in the LO signal. However, contrary to the prior art that endeavors to reduce such LO drift, here such drift is acceptable. Thus, in accordance with an exemplary embodiment, the local oscillator and/or local oscillator signal is allowed to drift. For example, the local oscillator may be an inexpensive LO that is know to drift. In other exemplary embodiments, the LO is not phase locked. In other words, the local oscillator signal that is mixed with the IF transmit signal and RF receive signal is not pinned using a Phase Lock Loop. In another exemplary embodiment, the LO signals to the transmit and receive portions may be phase locked to a LO that is allowed to drift. Stated another way, the LO signals used for up/down conversion in both the transmit portion and receive portion drift together. Stated yet another way, the system is configured such that frequency drift is acceptable as long as the transmit frequency drift and the receive frequency drift are correlated.

The transceiver system in general, and in an exemplary embodiment, the frequency correction device, is configured to perform frequency correction to compensate for drift in the LO. This frequency correction may be based on the drift detected in the IF receive signal. Stated more generally, in various exemplary embodiments, a reference signal, such as the RF receive signal, may be used to calculate and/or correct for error within the system.

For instance, in an exemplary embodiment, the frequency of the transmit IF signal, may be adjusted based on the calculated LO error so that the transmit RF output of the transceiver can still be transmitted exactly on the desired RF frequency. In one exemplary embodiment, the transmit IF signal is an output of a modem. In an exemplary embodiment, the IF transmit signal is frequency pre-corrected by the amount of the oscillator drift as such is determined from the drift in the IF receive signal. Pre-correcting the frequency of the IF transmit signal eliminates the effect of the drift in the oscillator signal in the RF transmit signal.

This pre-correcting may occur at any location in the system prior to the final upconversion. For example, in one exemplary embodiment, the IF transmit signal is pre-corrected in the modem indoor unit. In another exemplary embodiment, the IF transmit signal is pre-corrected in the transceiver prior to up-conversion in a first mixer of the transmitter portion. In another exemplary embodiment, the IF transmit signal is pre-corrected in the modulator or digitally prior to modulation.

Thus, in an exemplary embodiment, a frequency correction device is configured to pre-correct an IF transmit signal based on drift detected in the IF receive signal. Thus, the frequency correction device is configured to facilitate self correction for any drift by the common transmit portion/receive portion oscillator signal.

Figure 11A:
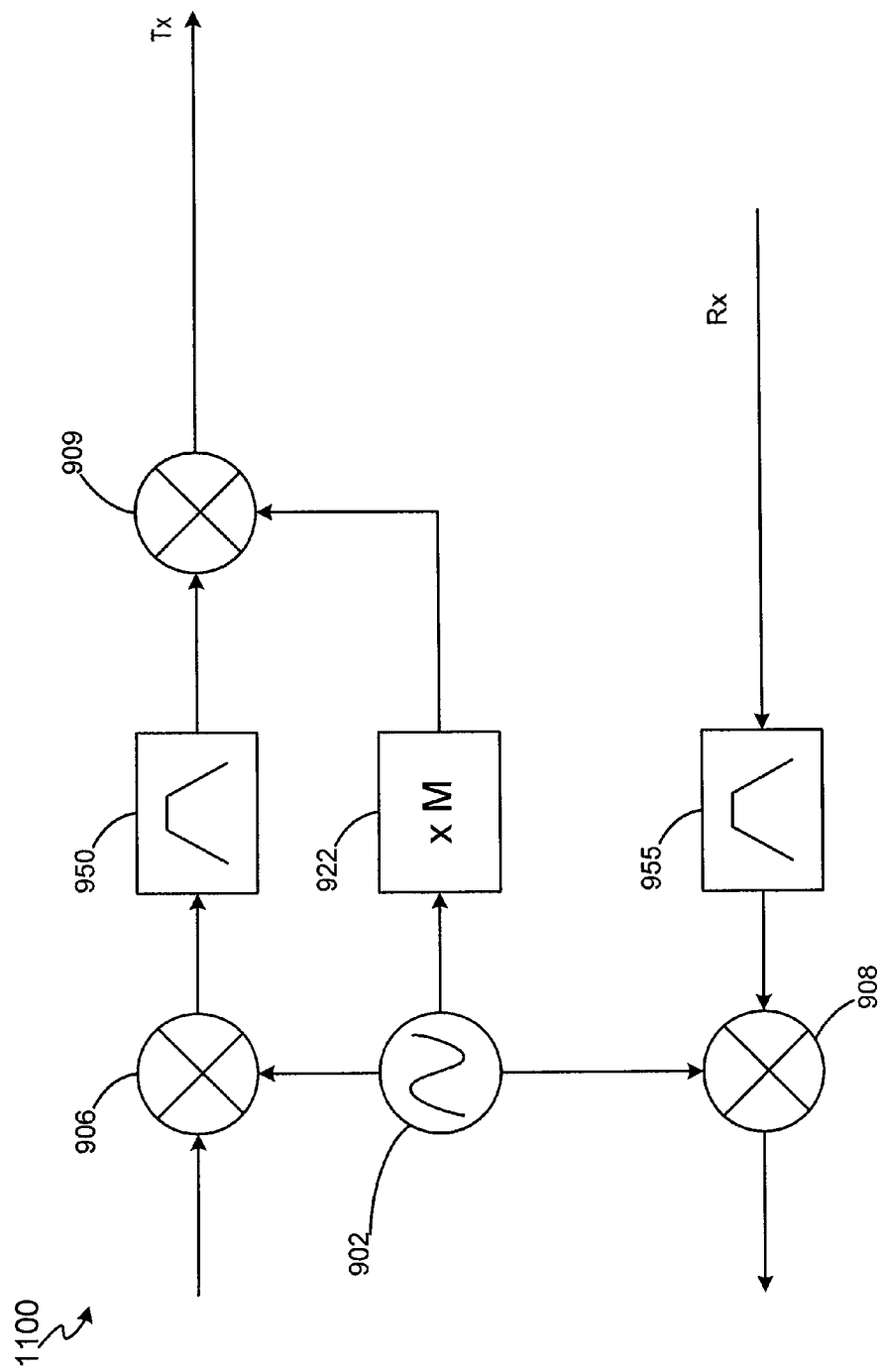
FIGS. 11A-11C illustrate, in block format, transceiver systems implementing dual super-heterodyne circuits in accordance with embodiments of the invention.
Figure 11B:
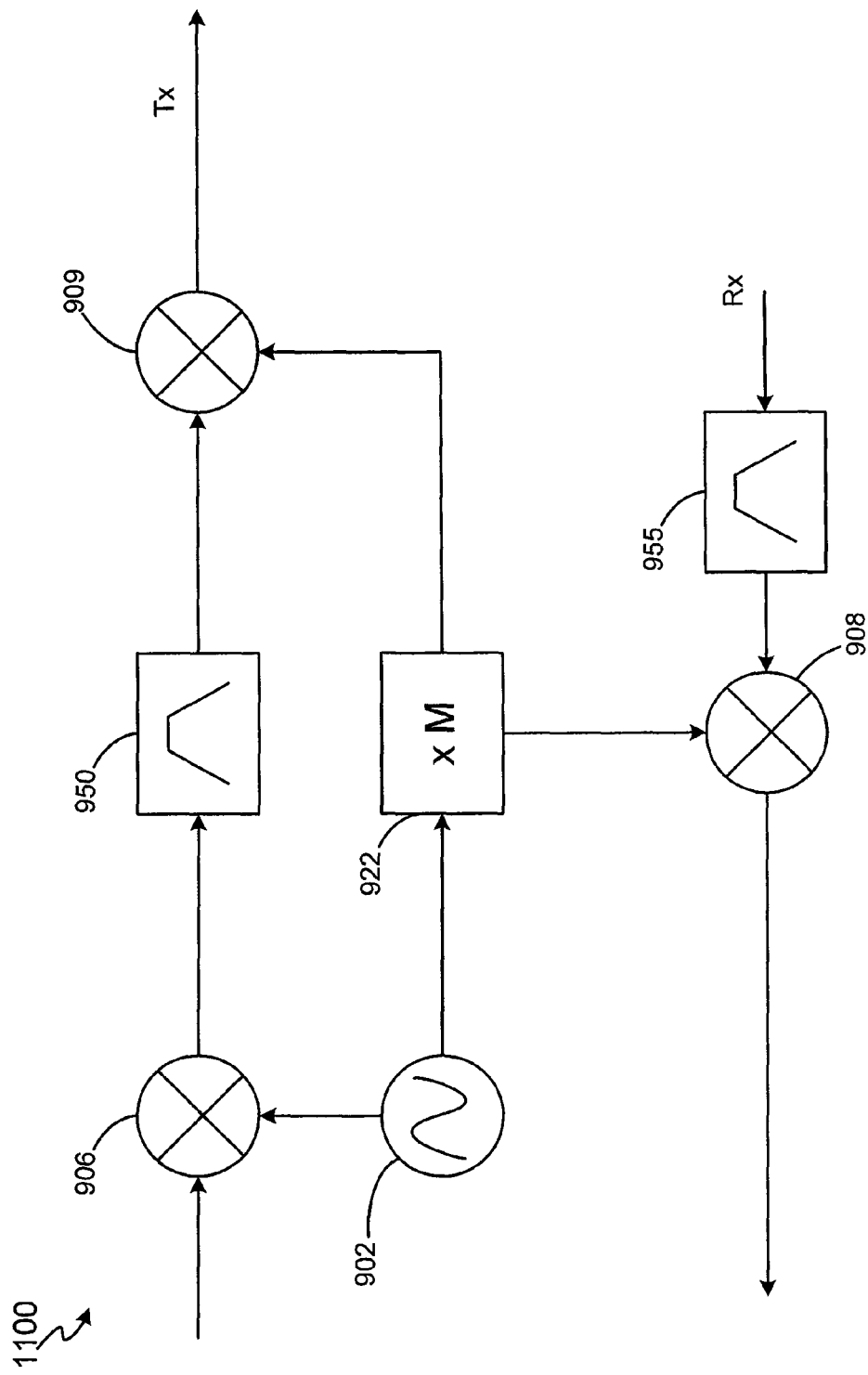
Figure 11C:
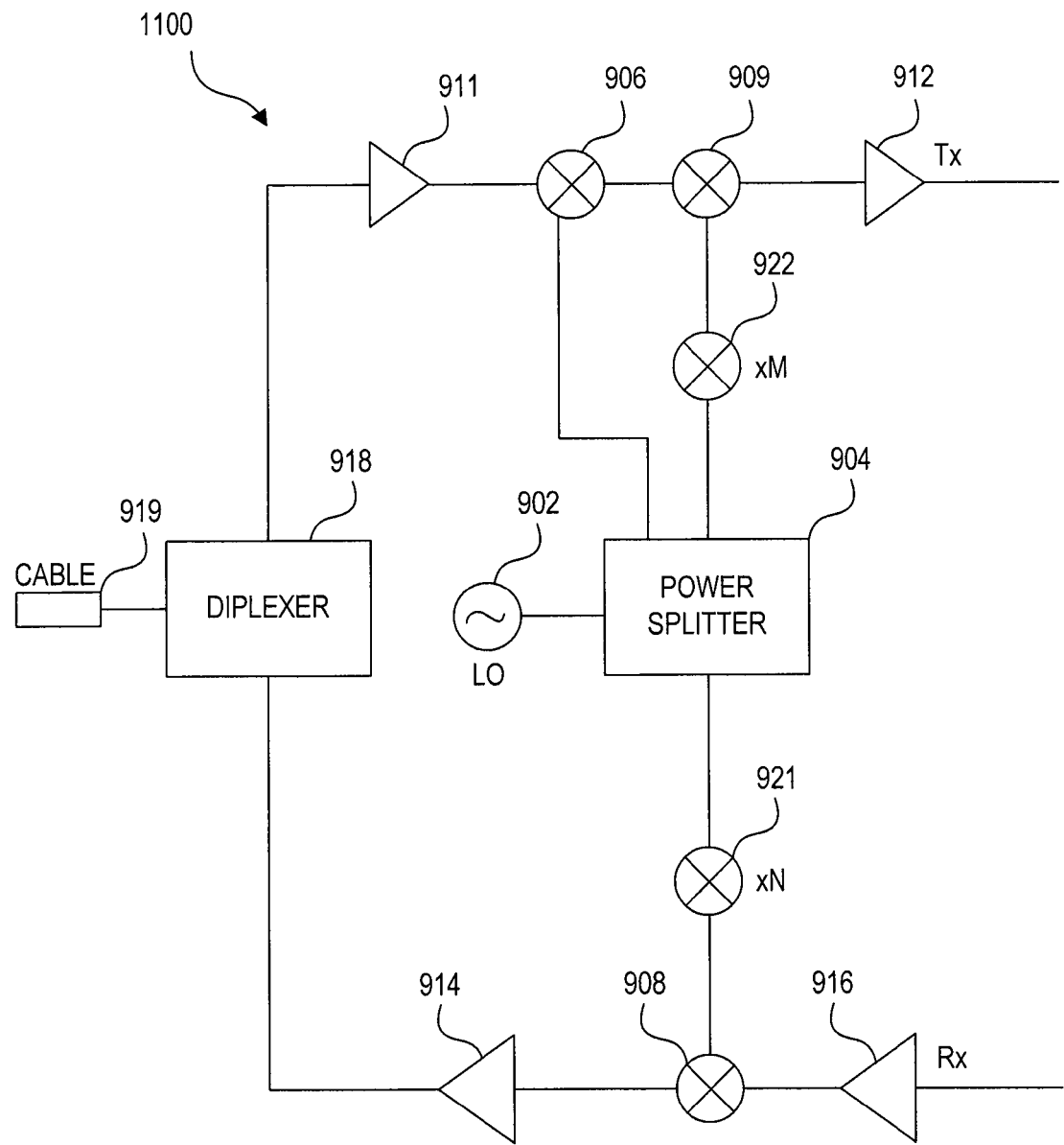

In various exemplary embodiments, and with reference to FIGS. 11A-11C, a transceiver employing frequency correction as described herein may further be implemented as a dual super-heterodyne transceiver. The dual super-heterodyne configuration may be employed, for example, in the transmit portion of the transceiver. In another exemplary embodiment, the dual super-heterodyne configuration may be employed, in the receive portion of the transceiver.

In radio and signal processing, heterodyning is the generation of new frequencies by mixing, or multiplying, two oscillating waveforms. It may be useful for modulation and demodulation of signals, or placing information of interest into a useful frequency range. In various exemplary embodiments, the two frequencies are mixed in a transistor, diode, mixer, or other signal processing device. In one exemplary embodiment, mixing two frequencies creates two new frequencies, according to the properties of the sine function: one at the sum of the two frequencies mixed, and the other at their difference. These new frequencies are called heterodynes. Typically only one of the new frequencies is desired—the higher one after modulation and the lower one after demodulation. The other signal may be filtered out of the output of the mixer. That said, the opposite implementation may also be used, where the lower one is used for upconversion and the higher one is used for down conversion.

In one exemplary embodiment, the dual super-heterodyne configuration may include at least one local oscillator 902 and/or a local oscillator signal from local oscillator 902. In accordance with an exemplary embodiment, transceiver 1100 comprises a local oscillator 902 configured to create an oscillator signal. In another exemplary embodiment, transceiver 1100 does not comprise an oscillator 902, but rather just comprises the oscillator signal. This may occur, for example, where the oscillator generating the oscillator signal is located outside transceiver 1100. In either event, the oscillator signal may be allowed to drift.

Transceiver 1100 may further comprise a transmit portion and a receive portion. Transmit portion may comprise a first mixer 906, and a second mixer 909. Consistent with the dual super-heterodyne configuration, the up-conversion in the transmit portion is performed by two or more mixers. The first mixer up-converts the IF transmit signal partially, and the second mixer completes the up-conversion. In an exemplary embodiment, mixer 906 up-converts with the LO signal and mixer 909 up-converts with a scaled version of the LO signal.

The receive portion may comprise a third mixer 908. Moreover, in various exemplary embodiments, the transmit portion may comprise a multiplier 922. In an exemplary embodiment, each mixer 906, 909, and 908 receives either the LO signal or a scaled version of the LO signal. In another exemplary embodiment, in place of or in addition to receiving a scaled version of the LO signal, any of mixers 906, 909, and 908 may be configured as a harmonic mixer configured to both scale the oscillator signal and mix the scaled oscillator signal with the input signal.

Each of mixers 906-909, and multipliers 922 and 921 are represented in FIGS. 11A-11C as a single element, however, it should be appreciated that each element merely demonstrates the function and is not intended to limit the scope to a single element. In fact, the multipliers may comprise several elements and/or stages of multiplication. Additionally, the term mixers may include multipliers, modulators and/or mixers. Frequency multipliers (doublers) and their intended functions are well known in the industry and will not be discussed in detail.

In an exemplary embodiment, and with reference to FIG. 11A-11C, a first transmit mixer 906 receives an IF transmit signal (provided for example from a modem) and an LO signal provided from LO 902. In accordance with an exemplary embodiment, mixer 906 mixes the signals and produces a signal that is either the sum or the difference of the IF and LO frequency signals. In a similar manner, and with reference to FIG. 11A, receive mixer 908 combines an RF receive signal with the LO signal to produce an IF frequency signal 921. The IF receive signal 921 may be provided to a modem, for example.

Transceiver 1100 may further comprise a filter 950 in the transmit portion. Transceiver 1100 may further comprise a filter 955 in the receive portion. Filters 950 and 955, may comprise any suitable band-pass filter. In general, filters are included to exclude spurious signals which commonly occur after mixing, splitting and/or dividing signals. Moreover, in an exemplary embodiment, filter 950 is located entirely on chip. In accordance with an exemplary embodiment, filter 950 is located between first and second mixers 906 and 909, respectively. Filters 950 and 955 suitably filter out signals not having a frequency within a pre-determined range and or ranges. Filters 950 and 955 suitably filter out spurs from their input signals. In one embodiment, the output of filters 950 and/or 955 may be amplified by amplifiers to account for any power loss.

In one exemplary embodiment, and with reference to FIG. 11C, the signal from local oscillator 902 may be split into substantially equal frequency signals by using a power splitter 904. In one exemplary embodiment, a power splitter may comprise any suitable component or combination of components configured to divide a power signal into two or more signals. In general, the signals resulting from the power splitter have a frequency equal to or substantially equal to the frequency of the original LO 902 signal. However, the signals resulting from the power splitter, such as power splitter 904, may be any desired frequency level which may be greater than, less than or substantially equal to the frequency of the original signal. In one exemplary embodiment, (again with reference to FIGS. 11A and 11B), two signals are brought from LO 902 without the use of a power splitter. These signals may be any desired frequency level which may be greater than, less than or substantially equal frequency of the original LO 902 signal. In general, these signals brought from LO 902 have a frequency equal to or substantially equal to the frequency of the original LO 902 signal. It should be noted that portions of the circuits reference in FIGS. 11A-11C can be implemented individually and/or simultaneously.

In various exemplary embodiments, transceiver is fully duplexed and comprises a duplexer 918. In this embodiment, signals to and from, for example, a modem, may be passed over a cable 919. In one exemplary embodiment, and with momentary reference to FIG. 11C, transceiver 1100 may further comprise a cable 919. The IF transmit signal may be provided over a cable 919 by way of a duplexer 918. Cable 919 may be any suitable cable used for signal transmission. As stated above, in general, a low cost, readily available cable is often desirable. In this manner, another advantage of this particular embodiment relates to the ability to transmit multiple signals over a single cable with each signal transmitting at or below the desired 3 GHz. In another exemplary embodiment, transceiver 1100 is a non-duplexed system.

One advantage of this particular embodiment is the ability to transmit multiple IF signals, having different frequencies, onto a single cable without risking interference among the signals. The unique frequency plan of the invention helps to enable this to occur by providing sufficient separation in frequency between the multiple IF signals to avoid interference. In various embodiments of the invention, a relationship between the LO signal frequencies is established such as (M+X)/N or M/(X+N), where X is equivalent to the number of additional local oscillator signals mixed in the transceiver portion not including the multiplied LO signal. M and N may be equivalent or different integers. N may not be zero. For example, one signal is multiplied to be two times the original LO frequency plus the original LO frequency and a second signal is multiplied to be two times the LO frequency, thus resulting in a two-thirds relationship between the signal frequencies. In one exemplary embodiment MN is any ratio other than +1. Alternatively, in the case where a power splitter splits the signal from LO 902 into two signals, one of the signals coming from the power splitter may be scaled by a frequency of a desired percentage that is not substantially the same as the frequency of the other signal coming from the power splitter.

In another exemplary embodiment, and with reference to FIG. 11C, the frequency plan in accordance with the invention further includes amplifiers 911-916. Amplifiers 911-916 may comprise any known or discovered amplification device(s) or element(s). Amplifiers may be included in the "transmitting arm" of the system and/or amplifiers may suitably be included in the "receiving arm" of the system. Typically there is some loss associated with transceiving systems of the type depicted in FIGS. 11A-11C. Signal loss may be due to line loss, interference, signal splitting and combining, and various other causes well known in the communications industry. Amplifiers may be suitably configured to account for any signal loss and amplify the signals accordingly.

In an exemplary embodiment, the dual super-heterodyne circuit configuration or other previously described circuit configurations may include one or more duplexer(s), such as for bi-directional communications (duplex). The duplexer may be any suitable duplexer designed for operation in the frequency band used by the receive signal and/or transmit signal. In various exemplary embodiments, the duplexer is capable of handling the output power of the transmitter. The duplexer may provide adequate rejection of transmitter noise occurring at the receive frequency, and may be designed to operate at, or less than, the frequency separation between the transmitter and receiver. Additionally, the duplexer may provide sufficient isolation to prevent receiver desensitization. Alternatively, in another exemplary embodiment, the above referenced circuits may not include a duplexer.

In various exemplary embodiments, the dual conversion transmitter is configured to create RF transmit signals and RF receive signals that each comprise one of: K band frequencies, Ka band frequencies, FCC assigned internet access band frequencies, home satellite band frequencies, and KuTV band frequencies. In various exemplary embodiments, the aforementioned electronic devices may be implemented as a transmitter, and/or a transceiver. These devices may be in communication with and/or coupled to a satellite.

In spot beam communication satellite systems both frequency and polarization diversity are utilized to reduce interference from adjacent spot beams. In an exemplary embodiment, both frequencies and polarizations are re-used in other beams that are geographically separated to maximize communications traffic capacity. The spot beam patterns are generally identified on a map using different colors to identify the combination of frequency and polarity used in that spot beam. The frequency and polarity re-use pattern is then defined by how many different combinations (or "colors") are used.

In accordance with various exemplary embodiments, an antenna system is configured for frequency and polarization switching. In one specific exemplary embodiment, the frequency and polarization switching comprises switching between two frequency ranges and between two different polarizations. This may be known as four color switching. In other exemplary embodiments, the frequency and polarization switching comprises switching between three frequency ranges and between two different polarizations, for a total of six separate colors. Furthermore, in various exemplary embodiments, the frequency and polarization switching may comprise switching between two polarizations with any suitable number of frequency ranges. In another exemplary embodiment, the frequency and polarization switching may comprise switching between more than two polarizations with any suitable number of frequency ranges.

In accordance with various exemplary embodiments, the ability to perform frequency and polarization switching has many benefits in terrestrial microwave communications terminals. Terrestrial microwave communications terminals, in one exemplary embodiment, comprise point to point terminals. In another exemplary embodiment, terrestrial microwave communications terminals comprise ground terminals for use in communication with a satellite. These terrestrial microwave communications terminals are spot beam based systems.

Prior art spot beam based systems use frequency and polarization diversity to reduce or eliminate interference from adjacent spot beams. This allows frequency reuse in non-adjacent beams resulting in increased satellite capacity and throughput. Unfortunately, in the prior art, in order to have such diversity, installers of such systems must be able to set the correct polarity at installation or carry different polarity versions of the terminal. For example, at an installation site, an installer might carry a first terminal configured for left hand polarization and a second terminal configured for right hand polarization and use the first terminal in one geographic area and the second terminal in another geographic area. Alternatively, the installer might be able to disassemble and reassemble a terminal to switch it from one polarization to another polarization. This might be done, for example, by removing the polarizer, rotating it 90 degrees, and reinstalling the polarizer in this new orientation. These prior art solutions are cumbersome in that it is not desirable to have to carry a variety of components at the installation site. Also, the manual disassembly/reassembly steps introduce the possibility of human error and/or defects.

These prior art solutions, moreover, for all practical purposes, permanently set the frequency range and polarization for a particular terminal. This is so because any change to the frequency range and polarization will involve the time and expense of a service call. An installer would have to visit the physical location and change the polarization either by using the disassembly/re-assembly technique or by just switching out the entire terminal. In the consumer broadband satellite terminal market, the cost of the service call can exceed the cost of the equipment and in general manually changing polarity in such terminals is economically unfeasible.

In accordance with various exemplary embodiments, a low cost system and method for electronically or electro-mechanically switching frequency ranges and/or polarity is provided. In an exemplary embodiment, the frequency range and/or polarization of a terminal can be changed without a human touching the terminal. Stated another way, the frequency range and/or polarization of a terminal can be changed without a service call. In an exemplary embodiment, the system is configured to remotely cause the frequency range and/or polarity of the terminal to change.

In one exemplary embodiment, the system and method facilitate installing a single type of terminal that is capable of being electronically set to a desired frequency range from among two or more frequency ranges. Some exemplary frequency ranges include receiving 10.7 GHz to 12.75 GHz, transmitting 13.75 GHz to 14.5 GHz, receiving 18.3 GHz to 20.2 GHz, and transmitting 28.1 GHz to 30.0 GHz. Furthermore, other desired frequency ranges of a point-to-point system fall within 15 GHz to 38 GHz. In another exemplary embodiment, the system and method facilitate installing a single type of terminal that is capable of being electronically set to a desired polarity from among two or more polarities. The polarities may comprise, for example, left hand circular, right hand circular, vertical linear, horizontal linear, or any other orthogonal polarization. Moreover, in various exemplary embodiments, a single type of terminal may be installed that is capable of electronically selecting both the frequency range and the polarity of the terminal from among choices of frequency range and polarity, respectively.

In an exemplary embodiment, transmit and receive signals are paired so that a common switching mechanism switches both signals simultaneously. For example, one "color" may be a receive signal in the frequency range of 19.7 GHz to 20.2 GHz using RHCP, and a transmit signal in the frequency range of 29.5 GHz to 30.0 GHz using LHCP. Another "color" may use the same frequency ranges but transmit using RHCP and receive using LHCP. Accordingly, in an exemplary embodiment, transmit and receive signals are operated at opposite polarizations. However, in some exemplary embodiments, transmit and receive signals are operated on the same polarization which increases the signal isolation requirements for self-interference free operation.

Thus, a single terminal type may be installed that can be configured in a first manner for a first geographical area and in a second manner for a second geographical area that is different from the first area.

In accordance with an exemplary embodiment, a terrestrial microwave communications terminal is configured to facilitate load balancing. Load balancing involves moving some of the load on a particular satellite, or point-to-point system, from one polarity/frequency range "color" or "beam" to another. The load balancing is enabled by the ability to remotely switch frequency range and/or polarity.

Thus, in exemplary embodiments, a method of load balancing comprises the steps of remotely switching frequency range and/or polarity of one or more terrestrial microwave communications terminals. For example, system operators or load monitoring computers may determine that dynamic changes in system bandwidth resources has created a situation where it would be advantageous to move certain users to adjacent beams that may be less congested. In one example, those users may be moved back at a later time as the loading changes again. In an exemplary embodiment, this signal switching (and therefore this satellite capacity "load balancing") can be performed periodically. In other exemplary embodiments, load balancing can be performed on many terminals (e.g., hundreds or thousands of terminals) simultaneously or substantially simultaneously. In other exemplary embodiments, load balancing can be performed on many terminals without the need for thousands of user terminals to be manually reconfigured.

In an exemplary embodiment, the load balancing is performed as frequently as necessary based on system loading. For example, load balancing could be done on a seasonal basis. For example, loads may change significantly when schools, colleges, and the like start and end their sessions. As another example, vacation seasons may give rise to significant load variations. In another example, load balancing is performed on an hourly basis. Furthermore, load balancing could be performed at any suitable time. In one example, if maximum usage is between 6-7 PM then some of the users in the heaviest loaded beam areas could be switched to adjacent beams in a different time zone. In another example, if a geographic area comprises both office and home terminals, and the office terminals experience heaviest loads at different times than the home terminals. In yet another embodiment, a particular area may have increased localized traffic, such as during a sporting event or a convention.

In an exemplary embodiment, the switching may occur with any regularity. For example, the polarization may be switched during the evening hours, and then switched back during business hours to reflect transmission load variations that occur over time. In an exemplary embodiment, the polarization may be switched thousands of times during the life of the device.

Figure 10:
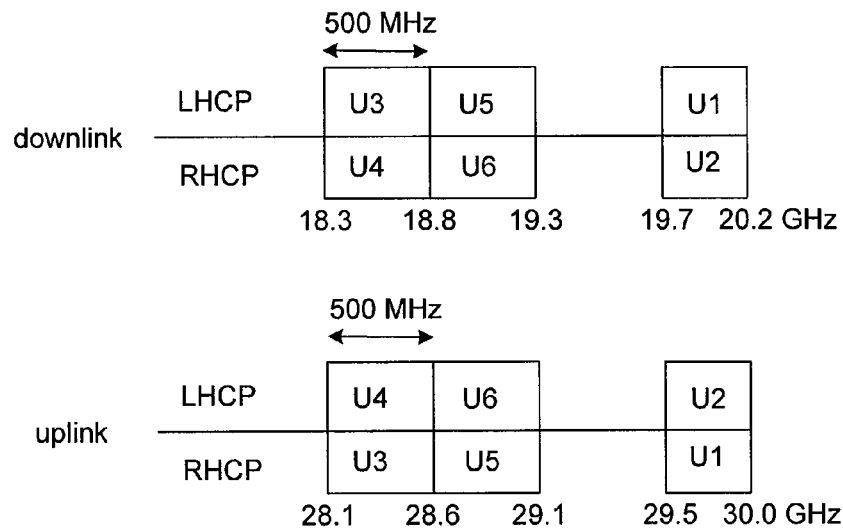
FIG. 10 illustrates an exemplary embodiment of color distribution.
Figure 10:
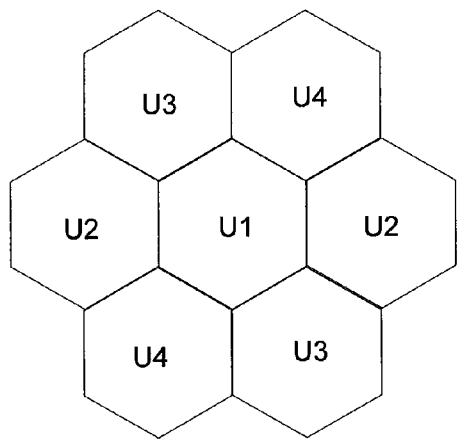
Figure 10:
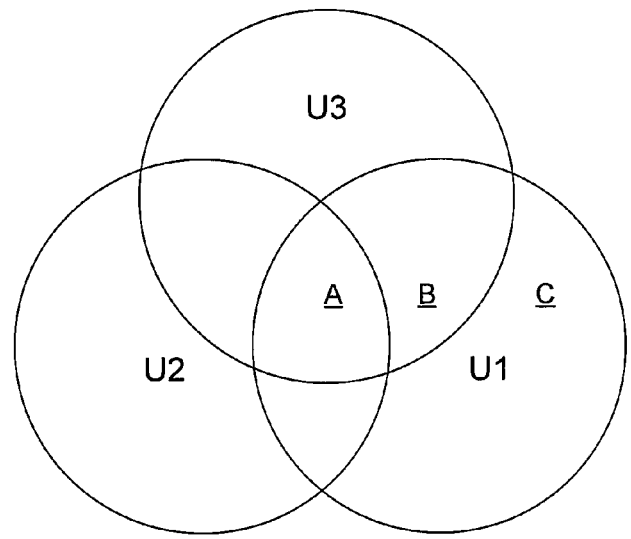

In accordance with an exemplary embodiment, and with reference to FIG. 10, a satellite may have a downlink, an uplink, and a coverage area. The coverage area may be comprised of smaller regions each corresponding to a spot beam to illuminate the respective region. Spot beams may be adjacent to one another and have overlapping regions. A satellite communications system has many parameters to work: (1) number of orthogonal time or frequency slots (defined as color patterns hereafter); (2) beam spacing (characterized by the beam roll-off at the cross-over point); (3) frequency re-use patterns (the re-use patterns can be regular in structures, where a uniformly distributed capacity is required); and (4)

numbers of beams (a satellite with more beams will provide more system flexibility and better bandwidth efficiency). Polarization may be used as a quantity to define a re-use pattern in addition to time or frequency slots. In one exemplary embodiment, the spot beams may comprise a first spot beam and a second spot beam. The first spot beam may illuminate a first region within a geographic area, in order to send information to a first plurality of subscriber terminals. The second spot beam may illuminate a second region within the geographic area and adjacent to the first region, in order to send information to a second plurality of subscriber terminals. The first and second regions may overlap.

The first spot beam may have a first characteristic polarization. The second spot beam may have a second characteristic polarization that is orthogonal to the first polarization. The polarization orthogonality serves to provide an isolation quantity between adjacent beams. Polarization may be combined with frequency slots to achieve a higher degree of isolation between adjacent beams and their respective coverage areas. The subscriber terminals in the first beam may have a polarization that matches the first characteristic polarization. The subscriber terminals in the second beam may have a polarization that matches the second characteristic polarization. The subscriber terminals in the overlap region of the adjacent beams may be optionally assigned to the first beam or to the second beam. This optional assignment is a flexibility within the satellite system and may be altered through reassignment following the start of service for any subscriber terminals within the overlapping region. The ability to remotely change the polarization of a subscriber terminal in an overlapping region illuminated by adjacent spot beams is an important improvement in the operation and optimization of the use of the satellite resources for changing subscriber distributions and quantities. For example it may be an efficient use of satellite resources and improvement to the individual subscriber service to reassign a user or a group of users from a first beam to a second beam or from a second beam to a first beam. Satellite systems using polarization as a quantity to provide isolation between adjacent beams may thus be configured to change the polarization remotely by sending a signal containing a command to switch or change the polarization form a first polarization state to a second orthogonal polarization state. The intentional changing of the polarization may facilitate reassignment to an adjacent beam in a spot beam satellite system using polarization for increasing a beam isolation quantity.

In accordance with an exemplary embodiment, the system is configured to facilitate remote addressability of subscriber terminals. In one exemplary embodiment, the system is configured to remotely address a specific terminal. The system may be configured to address each subscriber terminal. In another exemplary embodiment, a group of subscriber terminals may be addressable. Thus, a remote signal may command a terminal or group of terminals to switch from one color to another color. The terminals may be addressable in any suitable manner. In one exemplary embodiment, an IP address is associated with each terminal. In an exemplary embodiment, the terminals may be addressable through the modems or set top boxes. Thus, in accordance with an exemplary embodiment, the system is configured for remotely changing a characteristic polarization of a subscriber terminal by sending a command addressed to a particular terminal.

The down link may comprise multiple "colors" based on combinations of selected frequency and/or polarizations. Although other frequencies and frequency ranges may be used, and other polarizations as well, an example is provided of one multicolor embodiment. For example, in the downlink, colors U1, U3, and U5 are Left-Hand Circular Polarized ("LHCP") and colors U2, U4, and U6 are Right-Hand Circular Polarized ("RHCP"). In the frequency domain, colors U3 and U4 are from 18.3-18.8 GHz; U5 and U6 are from 18.8-19.3 GHz; and U1 and U2 are from 19.7-20.2 GHz. It will be noted that in this exemplary embodiment, each color represents a 500 MHz frequency range. Other frequency ranges may be used in other exemplary embodiments. Thus, selecting one of LHCP or RHCP and designating a frequency band from among the options available will specify a color. Similarly, the uplink comprises frequency/polarization combinations that can be each designated as a color. Often, the LHCP and RHCP are reversed as illustrated, providing increased signal isolation, but this is not necessary. In the uplink, colors U1, U3, and U5 are RHCP and colors U2, U4, and U6 are LHCP. In the frequency domain, colors U3 and U4 are from 28.1-28.6 GHz; U5 and U6 are from 28.6-29.1 GHz; and U1 and U2 are from 29.5-30.0 GHz. It will be noted that in this exemplary embodiment, each color similarly represents a 500 MHz frequency range.

In an exemplary embodiment, the satellite may broadcast multiple spot beams. Some of the spot beams are of one color and others are of a different color. For signal separation, the spot beams of similar color are typically not located adjacent to each other. In an exemplary embodiment, and with reference again to FIG. 10, the distribution pattern illustrated provides one exemplary layout pattern for four color spot beam frequency re-use. It should be recognized that with this pattern, color U1 will not be next to another color U1, etc. It should be noted, however, that typically the spot beams will over lap and that the spot beams may be better represented with circular areas of coverage. Furthermore, it should be appreciated that the strength of the signal may decrease with distance from the center of the circle, so that the circle is only an approximation of the coverage of the particular spot beam. The circular areas of coverage may be overlaid on a map to determine what spot beam(s) are available in a particular area.

Thus, an individual with a four color switchable transceiver that is located at location A on the map (see FIG. 10, Practical Distribution Illustration), would have available to them colors U1, U2, and U3. The transceiver could be switched to operate on one of those three colors as best suits the needs at the time. Likewise, location B on the map would have colors U1 and U3 available. Lastly, location C on the map would have color U1 available. In many practical circumstances, a transceiver will have two or three color options available in a particular area.

It should be noted that colors U5 and U6 might also be used and further increase the options of colors to use in a spot beam pattern. This may also further increase the options available to a particular transceiver in a particular location. Although described as a four or six color embodiment, any suitable number of colors may be used for color switching as described herein. Also, although described herein as a satellite, it is intended that the description is valid for other similar remote communication systems that are configured to communicate with the transceiver.

The frequency range/polarization of the terminal may be selected at least one of remotely, locally, manually, or some combination thereof. In one exemplary embodiment, the terminal is configured to be remotely controlled to switch from one frequency range/polarization to another. For example, the terminal may receive a signal from a central system that controls switching the frequency range/polarization. The central system may determine that load changes have significantly slowed down the left hand polarized channel, but that the right hand polarized channel has available bandwidth. The central system could then remotely switch the polarization of a number of terminals. This would improve channel availability for switched and non-switched users alike. Moreover, the units to switch may be selected based on geography, weather, use characteristics, individual bandwidth requirements, and/or other considerations. Furthermore, the switching of frequency range/polarization could be in response to the customer calling the company about poor transmission quality.

It should be noted that although described herein in the context of switching both frequency range and polarization, benefits and advantages similar to those discussed herein may be realized when switching just one of frequency or polarization.

The frequency range switching described herein may be performed in any number of ways. In an exemplary embodiment, the frequency range switching is performed electronically. For example, the frequency range switching may be implemented by adjusting phase shifters in a phased array, switching between fixed frequency oscillators or converters, and/or a tunable dual conversion transmitter comprising a tunable oscillator signal. Additional aspects of frequency switching for use with the present invention are disclosed in a co-pending U.S. patent application entitled "DUAL CONVERSION TRANSMITTER WITH SINGLE LOCAL OSCILLATOR" having the same filing date as the present application, the contents of which are hereby incorporated by reference in their entirety.

In accordance with another exemplary embodiment, the polarization switching described herein may be performed in any number of ways. In an exemplary embodiment, the polarization switching is performed electronically by adjusting the relative phase of signals at orthogonal antenna ports, or in another embodiment mechanically. For example, the polarization switching may be implemented by use of a trumpet switch. The trumpet switch may be actuated electronically. For example, the trumpet switch may be actuated by electronic magnet, servo, an inductor, a solenoid, a spring, a motor, an electro-mechanical device, or any combination thereof. Moreover, the switching mechanism can be any mechanism configured to move and maintain the position of trumpet switch. Furthermore, in an exemplary embodiment, trumpet switch is held in position by a latching mechanism. The latching mechanism, for example, may be fixed magnets. The latching mechanism keeps trumpet switch in place until the antenna is switched to another polarization.

As described herein, the terminal may be configured to receive a signal causing switching and the signal may be from a remote source. For example, the remote source may be a central office. In another example, an installer or customer can switch the polarization using a local computer connected to the terminal which sends commands to the switch. In another embodiment, an installer or customer can switch the polarization using the television set-top box which in turn sends signals to the switch. The polarization switching may occur during installation, as a means to increase performance, or as another option for troubleshooting poor performance.

In other exemplary embodiments, manual methods may be used to change a terminal from one polarization to another. This can be accomplished by physically moving a switch within the housing of the system or by extending the switch outside the housing to make it easier to manually switch the polarization. This could be done by either an installer or customer.

As previously noted satellite delivered spot beams are sent a specific frequencies and specific time intervals. Because satellites have a limited-number of frequencies to use, the ability to re-use a frequency for different geographical locations (without different data interfering with each other at the receiver) allows for more simplified receiver designs. Additionally, as previously mentioned, utilizing orthogonal polarization of the spot beams can increase available bandwidth.

Satellite based providers have traditionally been allocated multiple discrete frequency bands for communications. Traditional satellite communication systems, on the other hand, have been designed to operate using a single specific discrete frequency range and/or only a 1-2 neighboring edge overlapping frequency ranges. This discrete frequency range and/or ranges will generally match one of the frequency range and/or ranges of a communicating satellite. In general, it was not cost efficient to design a VSAT (very small aperture terminal) capable of communicating with the satellite on all of the satellite's allocated discrete frequency ranges. Previously, this would require the addition of one or multiple filter banks to communicate across multiple frequency ranges. Additionally, switching from one preset frequency range on traditional satellite communication systems to the potentially additional pre-set frequency range often required a manual alteration of the hardware equipment or in some cases total replacement of the complete satellite terminal with a terminal pre-set for a different frequency range and/or ranges.

Moreover, different satellite communication providers are allocated different multiple discrete frequency ranges. Traditional satellite terminals have not been compatible with these different satellite communication systems as the preset frequency range and/or ranges of the terminal did not include the alternative frequency ranges of these other satellite communication providers.

In various exemplary embodiments, the dual conversion transmitter is configured to create RF transmit signals. The RF transmit signals may comprise a frequency range. This frequency range may have a selectable start point and a selectable end point. For instance, the range may be from 28.3-28.8 GHz. Alternatively, the range may be 28.1-28.6 GHz. Although bandwidths of 500 MHz have been used as previous examples, the present disclosure may be directed to any suitable frequency range or interval of frequencies. For instance, the RF transmit signals and RF receive signals may be frequency tuned to a desired color pattern. Alternatively, the frequency range is equal to a selectable frequency range of a provided satellite transmitter.

Various embodiments of the tunable dual conversion transmitter, are capable of tuning the frequency range of the dual conversion transmitter to communicate across any suitable frequency range offered by any satellite communication provider and/or any desired frequency range. Various embodiments of the present design deliver a robust, low cost solution to achieving variable frequency ranges.

Moreover, as previously described, transceivers, receivers, and/or transmitters as described herein may be tuned remotely and/or manually. Actuation of a frequency tune can be performed in response to programming and/or a request by a user and/or device. For instance, a controller located in a remote control room may be electronically coupled to the device. This controller may monitor device usage and may actuate a change from a first frequency range to a second frequency range in response to an observed condition. This observed condition may any suitable condition, such as a malfunctioning element of the satellite, load on a particular frequency band, and/or time of day. Alternatively, internal or remote programming may actuate a change from a first frequency range to a second frequency range in response to an observed condition. In yet another exemplary embodiment, a device in communication with the present electronic device may actuate a change from a first frequency range to a second frequency range in response to an observed condition. This device may be an audio visual device, a satellite and/or other suitable electronic device.

All previously disclosed exemplary embodiments, of the device can be used with cellular telephone systems, and/or satellite based audio, visual, and data systems. Additional electronic components, microprocessing components, radio frequency components, antennas, power sources, interfaces, memory, and/or software may be added to the device as needed.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as critical, required, or essential features or elements of any or all the claims. As used herein, the terms "includes," "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Further, no element described herein is required for the practice of the invention unless expressly described as "essential" or "critical."

Additional Statements

In one exemplary embodiment, an electronic device may include (1) a first mixer configured to receive a first oscillator signal; the first mixer configured to receive a communication signal from an input to the electronic device; the first mixer configured to output a converted signal based on the first oscillator signal and the communication signal; (2) a filter configured to remove undesired spurious signals from the converted signal and output a filtered signal; and (3) a second mixer in communication with the filter and configured to receive the filtered signal, the second mixer configured to receive a scaled version of the first oscillator signal; the second mixer in communication with an output of the electronic device and configured to output an output signal based on the scaled version of the first oscillator signal and the filtered signal. The electronic device may include one of: a multiple conversion transmitter, and a multiple conversion transceiver, and wherein the output signal has an output frequency that is tunable over an output frequency range by adjusting a frequency associated with the first oscillator signal over a first oscillator signal frequency range. The output of the electronic device may be an RF transmit signal, and wherein the RF transmit signal is configured to be frequency tuned to a desired color pattern. The RF transmit signal may be tunable over a transmit frequency range. The multiple conversion transmitter may be a dual conversion transmitter. The frequency tuning may be actuated remotely and/or locally. The frequency tuning may be actuated by observance of a condition. The frequency tuning may be actuated electronically and/or manually. The transmit frequency range may have a selectable start point and a selectable end point. The frequency range may be equal to a selected frequency range of a provided satellite transmitter. The electronic device may be configured with one or more filters residing on the same chip as a first mixer and a second mixer. The electronic device may be configured for tuning the frequency range so as to communicate using the operating frequency range of any spot beam satellite. The electronic device may not include a filter bank. The electronic device may include SiGe semiconductor material. The electronic device of may include a multiplier. The multiplier may be configured to scale the first oscillator signal to create the scaled version of the first oscillator signal, which is provided to the second mixer. The electronic device may be configured to create RF transmit signals and RF receive signals that each may include one of: K band frequencies, Ka band frequencies, FCC assigned internet access band frequencies, home satellite band frequencies, and KuTV band frequencies. The operating frequency may include at least two frequency colors in the Ka or Ku band. The electronic device may include a single oscillator configured to provide the first oscillator signal. The first oscillator signal may not be scaled in frequency using a phase lock loop.

In an alternative exemplary embodiment, a dual conversion transmitter may include (1) a single oscillator configured to generate a first oscillator signal; (2) a first mixer configured to receive the first oscillator signal from the single oscillator; the first mixer configured to receive a communication signal from an input to the dual conversion transmitter; the first mixer configured to output a converted signal based on the first oscillator signal and the communication signal; (3) a filter configured to band pass filter the converted signal and output a filtered signal; and (4) a second mixer in communication with the filter and configured to receive the filtered signal, the second mixer may also be in communication with the single oscillator and configured to receive a scaled version of the first oscillator signal; the second mixer may be in communication with an output of the dual conversion transmitter and configured to output an output signal based on the scaled version of the first oscillator signal and the filtered signal.

In an alternative exemplary embodiment, a multiple conversion transmitter may include a power splitter configured to receive an oscillator signal and to divide the oscillator signal into first and second signals; and a first multiplier configured to receive the first signal and to scale the frequency of the first signal to create a first scaled signal, wherein the frequency of the first scaled signal and the frequency of the second signal are not equal to each other. The first scaled signal may be used for frequency conversion in a second mixer of the transmitter, and wherein the second signal may be used for frequency conversion in a first mixer of the transmitter, wherein an output of the first mixer is filtered to create a filtered output and wherein the filtered output is input to the second mixer.

An alternative exemplary embodiment includes a dual conversion transmitter. The transmitter may be configured to divide a first oscillator signal into a second oscillator signal and a third oscillator signal. The transmitter may be configured to perform frequency scaling such that the second and third oscillator signals have different frequencies from each other. The transmitter may include: (1) a first mixer, wherein the first mixer is configured to utilize the second oscillator signal to facilitate frequency conversion; and (2) a second mixer, wherein the second mixer is configured to utilize the third oscillator signal to facilitate frequency conversion; and (3) a filter configured to filter the output of the first mixer and to provide the output of the filter to the input of the second mixer. The transmitter may include a first multiplier configured to scale the frequency of the third oscillator signal such that the second and third oscillator signals have different frequencies from each other. The transmitter may include a sub-harmonic mixer configured to scale the frequency of the third oscillator signal such that the second and third oscillator signals have different frequencies from each other. The transmit frequency conversion may be the result of one of: (i) the sum of an intermediate frequency ("IF") transmit signal frequency and the third oscillator signal frequency, and (ii) the difference of the IF transmit signal frequency and the third oscillator signal frequency. The multiple conversion transmitter may expand the intermediate frequency bandwidth with each subsequent conversion.

In an alternative exemplary embodiment, a method of producing an output signal via a dual conversion transmitter may include: (1) receiving a first oscillator signal, wherein the first oscillator signal is provided by a single tunable oscillator; (2) receiving a communication signal from an input to the dual conversion transmitter, wherein a first mixer may be configured to receive the communication signal; (3) providing a converted signal based on the first oscillator signal and the communication signal, wherein the first mixer may be configured to output the converted signal; (4) band pass filtering the converted signal to create a filtered signal, wherein a filter may be configured to provide the band pass filtering; (5) receiving the filtered signal, wherein a second mixer is in communication with the filter and configured to receive the filtered signal; (6) converting the filtered signal, in the second mixer, based on a scaled version of the first oscillator signal, wherein the second mixer may be in communication with an output of the dual conversion transmitter; and (7) delivering an output signal based on the scaled version of the first oscillator signal and the filtered signal to the output.

In an alternative exemplary embodiment, a method of up-converting a transmit signal in a dual conversion transmitter, may include: (1) providing a tunable oscillator signal to a dual conversion transmitter comprising at least two mixers; (2) performing, in a first mixer, a portion of the up-conversion of the dual conversion transmitter based on the tunable oscillator signal; and (3) performing, in a second mixer, another portion of the up-conversion of the dual conversion transmitter based upon a scaled version of the tunable oscillator signal.

A ground satellite communication system, the system may include: (1) an indoor unit and an outdoor unit in communication with said indoor unit, said outdoor unit comprising a transceiver system having: (1) a single oscillator, associated with a fully duplexed transceiver, configured to generate a first oscillator signal and a second oscillator signal, wherein said first and second oscillator signals are not scaled in frequency using a phase lock loop, wherein an M/N relationship exists between the frequencies of said first oscillator signal and said second oscillator signal, wherein M and N are each rational numbers other than zero, and wherein the ratio of M/N is any ratio other than 1; (2) a receiving section configured to utilize said first oscillator signal to facilitate frequency conversion in said receive section; and (3) a transmitting section configured to utilize said second oscillator signal to facilitate frequency conversion in said transmit section. A multiplier may be configured to scale the frequency of at least one of the first and second oscillator signals such that the first and second oscillator signals have different frequencies from each other. A harmonic mixer may be configured to scale the frequency of at least one of the first and second oscillator signals so that the first and second oscillator signals have different frequencies from each other. M may be equal to 2 and N may be equal to 1. M may be equal to 3 and N may be equal to 1. The multiplier may be implemented as part of a harmonic mixer configuration.

A ground satellite communication system, the system may include: an indoor unit and an outdoor unit in communication with the indoor unit, the outdoor unit comprising a transceiver system having: (A) a single oscillator, associated with a fully duplexed transceiver, configured to generate a first oscillator signal and a second oscillator signal, and wherein the first oscillator signal is substantially equal to the second oscillator signal; (B) a receiving section configured to utilize the second oscillator signal to facilitate frequency conversion in the receive section; and (C) a transmitting section configured to utilize the first oscillator signal to facilitate frequency conversion in the transmit section; and wherein at least one of: (1) the first oscillator signal is mixed with an Intermediate Frequency ("IF") transmit signal to create a sum frequency transmit output signal, and wherein the second oscillator signal is mixed with a radio frequency ("RF") receive signal to create a difference frequency receive output signal; and (2) the first oscillator signal is mixed with an IF transmit signal to create a difference frequency transmit output signal, and wherein the second oscillator signal is mixed with a RF receive signal to create a sum frequency receive output signal. The single oscillator may be a free running local oscillator and wherein the free running local oscillator is allowed to drift.

A signal transceiving method may include: (1) receiving a receive signal having a first frequency; (2) receiving a transmit signal having a second frequency; (3) generating an oscillator signal from an oscillator that is associated with a fully duplexed transceiver; (4) splitting the oscillator signal into a first signal and a second signal, wherein the first and second signals are not scaled in frequency using a phase lock loop; (5) scaling the frequency of the first signal to obtain a desired multiple of the first signal; (6) scaling the frequency of the second signal to obtain a desired multiple of the second signal, wherein an M/N relationship exists between the scaled frequencies of the first signal and the second signal, wherein M and N are each rational numbers other than 0, and wherein the ratio of M/N is any ratio other than 1; and (7) mixing the receive signal and the transmit signal respectively with the scaled versions of the first and second signals to facilitate frequency conversion in a receive section of the transceiver and a transmit section of the transceiver, respectively. A fully duplexed transceiver comprising both a transmit portion and a receive portion, and wherein said transmit portion comprises a first mixer and wherein said receive portion comprises a second mixer, wherein an oscillator signal is mixed with an intermediate frequency ("IF") transmit signal in said first mixer and wherein said oscillator signal is mixed with a radio frequency ("RF") receive signal in said second mixer, wherein the frequency of said IF transmit signal is different from the frequency of said RF receive signal, and wherein at least one of: (1) said first mixer adds said oscillator signal to said IF transmit signal, in the frequency domain, and wherein said second mixer subtracts said oscillator signal from said RF receive signal, in the frequency domain; and (2) said first mixer subtracts said oscillator signal from said IF transmit signal, in the frequency domain, and wherein said second mixer adds said oscillator signal to said RF receive signal, in the frequency domain.

A fully duplexed transceiver may include both a transmit portion and a receive portion, and wherein the transmit portion comprises a first mixer and wherein the receive portion comprises a second mixer, the fully duplexed transceiver further configured to divide a first oscillator signal into a second oscillator signal and a third oscillator signal, wherein the second and third oscillator signals are not scaled in frequency using a phase lock loop, wherein the second oscillator signal is mixed with an intermediate frequency ("IF") transmit signal in the first mixer, wherein the third oscillator signal is mixed with a radio frequency ("RF") receive signal in the second mixer; wherein the output signal frequency of the transmit portion is not equal to the frequency of the RF receive signal of the receive portion, and wherein the transceiver is configured to frequency scale at least one of the second and third oscillator signals such that the frequencies of the second and third oscillator signals are not equal to each other and such that the mixing of the second and third signals in the respective transmit portion and receive portion is configured to facilitate frequency conversion in at least one of the transmit portion and the receive portion. A harmonic mixer may facilitate the frequency scaling. A multiplier may facilitate the frequency scaling. The first oscillator signal may be generated by a single oscillator, and wherein the single oscillator may be a free running local oscillator. The free running local oscillator may be allowed to drift.

A fully duplexed transceiver having a transmit portion and a receive portion, the fully duplexed transceiver may include: (1) a power splitter configured to receive an oscillator signal and to divide the oscillator signal into first and second signals, each having a frequency substantially equal to the desired frequency of the oscillator signal, wherein the first and second signals are not scaled in frequency using a phase lock loop; and (2) a first multiplier configured to receive the first signal and to scale the frequency of the first signal by a factor of M, wherein the first signal, as scaled, is used for frequency conversion in the receive portion of the fully duplexed transceiver, wherein the second signal is used for frequency conversion in the transmit portion of the fully duplexed transceiver, and wherein M is any rational number other than zero and 1. A fully duplexed transceiver having a transmit portion and a receive portion, the fully duplexed transceiver may include a second multiplier configured to receive the second signal and to scale the frequency of the second signal by a factor of N, wherein the second signal, as scaled, is used for frequency conversion in the transmit portion of the fully duplexed transceiver, wherein N is any rational number other than zero, and wherein the ratio of M/N is any ratio other than 1. M to N may be the ratio of the receive to transmit frequency conversion. M may be equal to 2 and N may be equal to M may be equal to 3 and N may be equal to 1.

A transceiver having a transmit portion configured to transmit a radio frequency ("RF") transmit signal and a receive portion configured to receive a RF receive signal, the transceiver may include: (1) a power splitter configured to receive an oscillator signal and to divide the oscillator signal into first and second signals; and (2) a first multiplier configured to receive the first signal and to scale the frequency of the first signal to create a first scaled signal, wherein the frequencies of the first scaled signal and the second signal are not equal to each other, wherein the first scaled signal is used for frequency conversion in the transmit portion of the transceiver, and wherein the second signal is used for frequency conversion in the receive portion of the transceiver. The transmit frequency conversion may be the result of one of: (i) the sum of an intermediate frequency ("IF") transmit signal frequency and said first scaled signal frequency, and (ii) the difference of said IF transmit signal frequency and the first scaled signal frequency. The receive frequency conversion may be the result of one of: (i) the sum of said RF receive signal frequency and said second scaled signal frequency, and (ii) the difference of said RF receive signal frequency and said second scaled signal frequency.

A ground satellite communication system, the system may include: (A) an indoor unit; and (B) an outdoor unit in communication with the indoor unit, the outdoor unit comprising a transceiver system having: (1) a transceiver, wherein the transceiver is configured to divide a first oscillator signal into a second oscillator signal and a third oscillator signal, wherein the transceiver is configured to perform frequency scaling such that the second and third oscillator signals have different frequencies from each other, the transceiver further comprising: (2) a receive portion, wherein the receive portion is configured to utilize the second oscillator signal to facilitate frequency conversion in the receive portion; and (3) a transmit portion, wherein the transmit portion is configured to utilize the third oscillator signal to facilitate frequency conversion in the transmit portion. The relationship between the frequencies of the second and third oscillator signals may be the ratio of the receive to transmit frequency conversion.

A ground satellite communication system, the system may include: (A) an indoor unit; and (B) an outdoor unit in communication with the indoor unit, the outdoor unit comprising a transceiver system having: (1) a transceiver; (2) an oscillator, associated with the transceiver, wherein the oscillator is configured to generate a first oscillator signal and a second oscillator signal, the transceiver further comprising: (3) a receive portion, wherein the receive portion is configured to utilize the second oscillator signal to facilitate frequency conversion in the receive portion; and (4) a transmit portion, wherein the transmit portion is configured to utilize the first oscillator signal to facilitate frequency conversion in the transmit portion; and wherein one of: (i) the first oscillator signal is mixed with an intermediate frequency ("IF") transmit signal to create a sum frequency radio frequency ("RF") transmit signal, and wherein the second oscillator signal is mixed with a RF receive signal to create a difference frequency IF receive signal; and (ii) the first oscillator signal is mixed with an IF transmit signal to create a difference frequency RF transmit signal, and wherein the second oscillator signal is mixed with a RF receive signal to create a sum frequency IF receive signal. A harmonic mixer may be configured to scale the frequency of at least one of the first and second oscillator signals so that the first and second oscillator signals have different frequencies from each other.

A signal transceiving method which may include: (1) splitting an oscillator signal into a first signal and a second signal; (2) scaling the frequency of the first signal to obtain a desired multiple of the first signal; (3) scaling the frequency of the second signal to obtain a desired multiple of the second signal, wherein an M/N relationship exists between the scaled frequencies of the first signal and the second signal, wherein M and N are each rational numbers, wherein M does not equal zero, wherein N does not equal zero, and wherein the ratio of M/N is any ratio other than +1; and (4) mixing a radio frequency ("RF") receive signal, received at a receive portion of the transceiver, with the scaled version of the first signal to facilitate frequency conversion in the receive portion of the transceiver; and (5) mixing an intermediate frequency ("IF") transmit signal, received at a transmit portion of the transceiver, with the scaled version of the second signal to facilitate frequency conversion in the transmit portion of the transceiver; wherein the RF receive signal is not equal to a RF transmit signal that is output from the receive portion. The transmit frequency conversion may be the result of one of: (i) the sum of an intermediate frequency ("IF") transmit signal frequency and the frequency of the scaled version of the second signal, and (ii) the difference of the IF transmit signal frequency and the frequency of the scaled version of the second signal. The receive frequency conversion may be the result of one of: (i) the sum of the RF receive signal frequency and the frequency of the scaled version of the first signal, and (ii) the difference of the RF receive signal frequency and the frequency of the scaled version of the first signal.

A transceiver may include: (1) a transmit portion and a receive portion, wherein the transmit portion outputs a radio frequency ("RF") transmit signal, wherein the receive portion outputs a RF receive portion signal, wherein the transmit portion comprises a first mixer, and wherein the receive portion comprises a second mixer; and (2) an oscillator, wherein a signal from the oscillator is mixed with an intermediate frequency ("IF") transmit signal in the first mixer, wherein the signal from the oscillator is mixed with a RF receive signal in the second mixer; wherein the frequency of the RF transmit signal is different from the frequency of the RF receive signal, and wherein at least one of: (A) the first mixer adds the signal of the oscillator to the IF transmit signal, in the frequency domain, and wherein the second mixer subtracts the signal of the oscillator from the RF receive signal, in the frequency domain; and (B) the first mixer subtracts the signal of the oscillator from the IF transmit signal, in the frequency domain, and wherein the second mixer adds the signal of the oscillator to the RF receive signal, in the frequency domain. The oscillator may be a free running local oscillator, wherein the free running local oscillator is allowed to drift, and wherein the oscillator is not phase locked to a reference oscillator.

A transceiver may include: (1) a transmit portion and a receive portion, wherein the transmit portion comprises a first mixer and wherein the receive portion comprises a second mixer; and (2) an oscillator, wherein the oscillator is configured to generate a first oscillator signal, wherein the transceiver is configured to divide the first oscillator signal into a second oscillator signal and a third oscillator signal, wherein the second oscillator signal is mixed with an intermediate frequency ("IF") transmit signal in the first mixer, wherein the third oscillator signal is mixed with a radio frequency ("RF") receive signal in the second mixer; wherein an RF transmit signal frequency output from the transmit portion is not equal to the frequency of the RF receive signal received at the receive portion, and wherein the transceiver is configured to frequency scale at least one of the second and third oscillator signals such that the frequencies of the second and third oscillator signals are not equal to each other and such that the mixing of the second and third signals in the respective transmit portion and receive portion is configured to facilitate frequency conversion in at least one of the transmit portion and the receive portion. The oscillator may be a free running local oscillator, wherein the free running local oscillator is allowed to drift, and wherein the oscillator is not phase locked to a reference oscillator.

A transceiver having a transmit portion and a receive portion, the transceiver may include: (1) a power splitter configured to receive an oscillator signal and to divide the oscillator signal into first and second signals; and (2) a first multiplier configured to receive the first signal and to scale the frequency of the first signal to create a first scaled signal, wherein the frequencies of the first scaled signal and the second signal are not equal to each other, wherein the first scaled signal is used for frequency conversion in the receive portion of the transceiver, and wherein the second signal is used for frequency conversion in the transmit portion of the transceiver. An oscillator may be configured to generate the oscillator signal, wherein the oscillator is a free running local oscillator, wherein the free running local oscillator is allowed to drift, and wherein the oscillator is not phase locked to a reference oscillator.

What is claimed is:

1. A dual conversion transmitter, wherein the transmitter is configured to divide a first oscillator signal into a second oscillator signal and a third oscillator signal, wherein the transmitter is configured to perform frequency scaling such that the second and third oscillator signals have different frequencies from each other, the transmitter further comprising:

a first mixer, wherein the first mixer is configured to utilize the second oscillator signal to facilitate frequency conversion; and a second mixer, wherein the second mixer is configured to utilize the third oscillator signal to facilitate frequency conversion; and a filter configured to filter the output of the first mixer and to provide the output of the filter to the input of the second mixer; wherein the transmit frequency conversion is the result of one of: (i) the sum of an intermediate frequency ("IF") transmit signal frequency and the third oscillator signal frequency, and (ii) the difference of the IF transmit signal frequency and the third oscillator signal frequency.

2. The dual conversion transmitter of claim 1, the transmitter further comprising a first multiplier configured to scale the frequency of the third oscillator signal such that the second and third oscillator signals have different frequencies from each other.

3. The dual conversion transmitter of claim 1, the transmitter further comprising a sub-harmonic mixer configured to scale the frequency of the third oscillator signal such that the second and third oscillator signals have different frequencies from each other.

4. The dual conversion transmitter of claim 1, wherein the dual conversion transmitter expands the intermediate frequency bandwidth with each subsequent conversion.

* * * * *